(12) United States Patent
Ellison

(10) Patent No.: US 9,277,649 B2
(45) Date of Patent: Mar. 1, 2016

(54) CROSS TALK REDUCTION FOR HIGH-SPEED ELECTRICAL CONNECTORS

(71) Applicant: Jason John Ellison, Camp Hill, PA (US)

(72) Inventor: Jason John Ellison, Camp Hill, PA (US)

(73) Assignee: FCI Americas Technology LLC, Carson, NV (US)

( * ) Notice: Subject to any disclaimer, the term of this patent is extended or adjusted under 35 U.S.C. 154(b) by 0 days.

(21) Appl. No.: 13/644,092

(22) Filed: Oct. 3, 2012

(65) Prior Publication Data

US 2013/0092429 A1 Apr. 18, 2013

Related U.S. Application Data

(60) Provisional application No. 61/547,288, filed on Oct. 14, 2011.

(51) Int. Cl.
| | |
|---|---|
| *H05K 1/11* | (2006.01) |
| *H01R 12/52* | (2011.01) |
| *H01R 13/6471* | (2011.01) |
| *H05K 1/02* | (2006.01) |

(52) U.S. Cl.
CPC .............. *H05K 1/117* (2013.01); *H01R 12/523* (2013.01); *H01R 13/6471* (2013.01); *H05K 1/0218* (2013.01); *H05K 1/0219* (2013.01); *H05K 1/0245* (2013.01); *H05K 2201/09154* (2013.01); *H05K 2201/09354* (2013.01); *H05K 2201/09618* (2013.01); *H05K 2201/09781* (2013.01)

(58) Field of Classification Search
CPC .......... H05K 2201/09354; H05K 2201/09618; H05K 2201/09781
USPC ....................................................... 439/325
See application file for complete search history.

(56) References Cited

U.S. PATENT DOCUMENTS

| | | | |
|---|---|---|---|
| 2,664,552 | A | 12/1953 | Ericsson et al. |
| 2,849,700 | A | 8/1958 | Perkin |
| 2,858,372 | A | 10/1958 | Kaufman |
| 3,115,379 | A | 12/1963 | McKee |
| 3,286,220 | A | 11/1966 | Marley |
| 3,343,120 | A | 9/1967 | Whiting |
| 3,399,372 | A | 8/1968 | Uberbacher |

(Continued)

FOREIGN PATENT DOCUMENTS

| | | |
|---|---|---|
| EP | 0273683 | 7/1988 |
| EP | 0554821 | 8/1993 |

(Continued)

OTHER PUBLICATIONS

U.S. Appl. No. 60/584,928, filed Jul. 1, 2004, Cohen.

(Continued)

*Primary Examiner* — Timothy Thompson
*Assistant Examiner* — Krystal Robinson
(74) *Attorney, Agent, or Firm* — Baker & Hostetler LLP

(57) ABSTRACT

An electrical connector includes a printed circuit board that includes a body that carries a plurality of ground conductors that define respective ground contact pads, and a plurality of signal conductors that define respective signal contact pads. The contact pads are configured to mate with electrical contacts of a complementary electrical connector. The printed circuit board includes a ground coupling assembly that electrically connects at least a pair of the ground conductors.

29 Claims, 8 Drawing Sheets

(56) References Cited

U.S. PATENT DOCUMENTS

| | | | |
|---|---|---|---|
| 3,482,201 A | 12/1969 | Schneck | |
| 3,538,486 A | 11/1970 | Shlesinger, Jr. | |
| 3,587,028 A | 6/1971 | Uberbacher | |
| 3,591,834 A | 7/1971 | Kolias | |
| 3,601,775 A * | 8/1971 | Longenecker et al. | 439/636 |
| 3,641,475 A | 2/1972 | Irish et al. | |
| 3,663,925 A | 5/1972 | Proctor | |
| 3,669,054 A | 6/1972 | Desso et al. | |
| 3,701,076 A | 10/1972 | Irish | |
| 3,748,633 A | 7/1973 | Lundergan | |
| 3,827,005 A | 7/1974 | Friend | |
| 3,867,008 A | 2/1975 | Gartland, Jr. | |
| 4,030,792 A | 6/1977 | Fuerst | |
| 4,076,362 A | 2/1978 | Ichimura | |
| 4,084,872 A | 4/1978 | Pritulsky | |
| 4,157,612 A | 6/1979 | Rainal | |
| 4,159,861 A | 7/1979 | Anhalt | |
| 4,232,924 A | 11/1980 | Kline et al. | |
| 4,260,212 A | 4/1981 | Ritchie et al. | |
| 4,288,139 A | 9/1981 | Cobaugh et al. | |
| 4,383,724 A | 5/1983 | Verhoeven | |
| 4,402,563 A | 9/1983 | Sinclair | |
| 4,407,552 A | 10/1983 | Watanabe et al. | |
| 4,482,937 A | 11/1984 | Berg | |
| 4,487,464 A | 12/1984 | Kirschenbaum | |
| 4,523,296 A | 6/1985 | Healy, Jr. | |
| 4,560,222 A | 12/1985 | Dambach | |
| 4,571,014 A | 2/1986 | Robin et al. | |
| 4,607,899 A | 8/1986 | Romine et al. | |
| 4,664,456 A | 5/1987 | Blair et al. | |
| 4,664,458 A | 5/1987 | Worth | |
| 4,681,549 A | 7/1987 | Peterson | |
| 4,717,360 A | 1/1988 | Czaja | |
| 4,762,500 A | 8/1988 | Dola et al. | |
| 4,776,803 A | 10/1988 | Pretchel et al. | |
| 4,815,987 A | 3/1989 | Kawano et al. | |
| 4,846,727 A | 7/1989 | Glover et al. | |
| 4,850,887 A | 7/1989 | Sugawara | |
| 4,867,713 A | 9/1989 | Ozu et al. | |
| 4,871,319 A | 10/1989 | Babow | |
| 4,898,539 A | 2/1990 | Glover et al. | |
| 4,900,271 A | 2/1990 | Colleran et al. | |
| 4,907,990 A | 3/1990 | Bertho et al. | |
| 4,913,664 A | 4/1990 | Dixon et al. | |
| 4,917,616 A | 4/1990 | Demler, Jr. | |
| 4,932,888 A | 6/1990 | Senor | |
| 4,954,093 A | 9/1990 | Nadin | |
| 4,973,271 A | 11/1990 | Ishizuka et al. | |
| 4,975,066 A | 12/1990 | Sucheski et al. | |
| 4,975,069 A | 12/1990 | Fedder et al. | |
| 4,997,390 A | 3/1991 | Scholz et al. | |
| 5,004,426 A | 4/1991 | Barnett | |
| 5,046,960 A | 9/1991 | Fedder | |
| 5,055,054 A | 10/1991 | Doutrich | |
| 5,065,282 A | 11/1991 | Polonio | |
| 5,066,236 A | 11/1991 | Broeksteeg | |
| 5,077,893 A | 1/1992 | Mosquera et al. | |
| 5,094,623 A | 3/1992 | Scharf et al. | |
| 5,098,311 A | 3/1992 | Roath et al. | |
| 5,104,341 A | 4/1992 | Gilissen et al. | |
| 5,127,839 A | 7/1992 | Korsunsky et al. | |
| 5,141,455 A | 8/1992 | Ponn | |
| 5,161,987 A | 11/1992 | Sinisi | |
| 5,163,337 A | 11/1992 | Herron et al. | |
| 5,163,849 A | 11/1992 | Fogg et al. | |
| 5,167,528 A | 12/1992 | Nishiyama et al. | |
| 5,169,337 A | 12/1992 | Ortega et al. | |
| 5,174,770 A | 12/1992 | Sasaki et al. | |
| 5,181,855 A | 1/1993 | Mosquera et al. | |
| 5,197,893 A | 3/1993 | Morlion et al. | |
| 5,226,826 A | 7/1993 | Nillson et al. | |
| 5,228,864 A | 7/1993 | Fusselman et al. | |
| 5,231,274 A | 7/1993 | Reynier et al. | |
| 5,238,414 A | 8/1993 | Yaegashi et al. | |
| 5,254,012 A | 10/1993 | Wang | |
| 5,257,941 A | 11/1993 | Lwee et al. | |
| 5,274,918 A | 1/1994 | Reed | |
| 5,277,624 A | 1/1994 | Champion et al. | |
| 5,286,212 A | 2/1994 | Broeksteeg | |
| 5,288,949 A | 2/1994 | Crafts | |
| 5,302,135 A | 4/1994 | Lee | |
| 5,330,371 A | 7/1994 | Andrews | |
| 5,342,211 A | 8/1994 | Broeksteeg | |
| 5,356,300 A | 10/1994 | Costello et al. | |
| 5,356,301 A | 10/1994 | Champion et al. | |
| 5,357,050 A | 10/1994 | Baran et al. | |
| 5,382,168 A | 1/1995 | Azuma et al. | |
| 5,387,111 A | 2/1995 | DeSantis et al. | |
| 5,395,250 A | 3/1995 | Englert, Jr. et al. | |
| 5,399,104 A | 3/1995 | Middlehurst et al. | |
| 5,413,491 A | 5/1995 | Noschese | |
| 5,429,520 A | 7/1995 | Morlion et al. | |
| 5,431,578 A | 7/1995 | Wayne | |
| 5,441,425 A | 8/1995 | Kitamura | |
| 5,474,472 A | 12/1995 | Niwa et al. | |
| 5,475,922 A | 12/1995 | Tamura et al. | |
| 5,518,422 A | 5/1996 | Zell et al. | |
| 5,522,727 A | 6/1996 | Saito et al. | |
| 5,522,738 A | 6/1996 | Lace | |
| 5,558,542 A | 9/1996 | O'Sullivan et al. | |
| 5,564,949 A | 10/1996 | Wellinsky | |
| 5,575,688 A | 11/1996 | Crane, Jr. | |
| 5,586,908 A | 12/1996 | Lorrain | |
| 5,586,912 A | 12/1996 | Eslampour et al. | |
| 5,586,914 A | 12/1996 | Foster, Jr. et al. | |
| 5,590,463 A | 1/1997 | Feldman et al. | |
| 5,609,502 A | 3/1997 | Thumma | |
| 5,620,340 A | 4/1997 | Andrews | |
| 5,626,492 A | 5/1997 | Onizuka et al. | |
| 5,634,821 A | 6/1997 | Crane, Jr. | |
| 5,637,019 A | 6/1997 | Crane, Jr. et al. | |
| 5,664,968 A | 9/1997 | Mickievicz | |
| 5,668,408 A | 9/1997 | Nicholson | |
| 5,672,064 A | 9/1997 | Provencher et al. | |
| 5,697,799 A | 12/1997 | Consoli et al. | |
| 5,713,746 A | 2/1998 | Olson et al. | |
| 5,713,767 A | 2/1998 | Hanson et al. | |
| 5,716,237 A | 2/1998 | Conorich et al. | |
| 5,730,609 A | 3/1998 | Harwath | |
| 5,741,144 A | 4/1998 | Elco et al. | |
| 5,741,161 A | 4/1998 | Cahaly et al. | |
| 5,766,023 A | 6/1998 | Noschese et al. | |
| 5,775,947 A | 7/1998 | Suzuki et al. | |
| 5,782,656 A | 7/1998 | Zell et al. | |
| 5,795,191 A | 8/1998 | Preputnick et al. | |
| 5,803,768 A | 9/1998 | Zell et al. | |
| 5,817,973 A | 10/1998 | Elco et al. | |
| 5,820,392 A | 10/1998 | Lin et al. | |
| 5,823,828 A | 10/1998 | Bricaud et al. | |
| 5,833,475 A | 11/1998 | Mitra | |
| 5,853,797 A | 12/1998 | Fuchs et al. | |
| 5,860,816 A | 1/1999 | Provencher et al. | |
| 5,871,362 A | 2/1999 | Campbell et al. | |
| 5,876,222 A | 3/1999 | Gardner et al. | |
| 5,882,227 A | 3/1999 | Neidich | |
| 5,887,158 A | 3/1999 | Sample et al. | |
| 5,892,791 A | 4/1999 | Moon | |
| 5,893,761 A | 4/1999 | Longueville | |
| 5,902,136 A | 5/1999 | Lemke et al. | |
| 5,904,581 A | 5/1999 | Pope et al. | |
| 5,904,594 A | 5/1999 | Longueville et al. | |
| 5,908,333 A | 6/1999 | Perino et al. | |
| 5,921,810 A | 7/1999 | Murakoshi | |
| 5,938,479 A | 8/1999 | Paulson et al. | |
| 5,961,355 A | 10/1999 | Morlion et al. | |
| 5,967,844 A | 10/1999 | Doutrich et al. | |
| 5,971,817 A | 10/1999 | Longueville | |
| 5,980,321 A | 11/1999 | Cohen et al. | |
| 5,984,690 A | 11/1999 | Riechelmann et al. | |
| 5,992,953 A | 11/1999 | Rabinovitz | |
| 5,993,259 A | 11/1999 | Stokoe et al. | |
| 6,007,376 A | 12/1999 | Shimizu | |
| 6,022,227 A | 2/2000 | Huang | |
| 6,027,345 A | 2/2000 | McHugh et al. | |

(56) References Cited

U.S. PATENT DOCUMENTS

| | | |
|---|---|---|
| 6,042,427 A | 3/2000 | Adriaenssens et al. |
| 6,050,862 A | 4/2000 | Ishii |
| 6,053,751 A | 4/2000 | Humphrey |
| 6,068,520 A | 5/2000 | Winings et al. |
| 6,086,386 A | 7/2000 | Fjelstad et al. |
| 6,095,868 A | 8/2000 | Hyland et al. |
| 6,116,926 A | 9/2000 | Ortega et al. |
| 6,116,965 A | 9/2000 | Arnett et al. |
| 6,123,554 A | 9/2000 | Ortega et al. |
| 6,125,535 A | 10/2000 | Chiou et al. |
| 6,129,592 A | 10/2000 | Mickievicz et al. |
| 6,132,255 A | 10/2000 | Verhoeven |
| 6,139,336 A | 10/2000 | Olson |
| 6,146,157 A | 11/2000 | Lenoir et al. |
| 6,146,202 A | 11/2000 | Ramey et al. |
| 6,146,203 A | 11/2000 | Elco et al. |
| 6,152,747 A | 11/2000 | McNamara |
| 6,154,742 A | 11/2000 | Herriot |
| 6,168,458 B1 | 1/2001 | Kraft |
| 6,171,115 B1 | 1/2001 | Mickievicz et al. |
| 6,171,149 B1 | 1/2001 | Van Zanten |
| 6,179,663 B1 | 1/2001 | Bradley et al. |
| 6,190,213 B1 | 2/2001 | Reichart et al. |
| 6,210,227 B1 | 4/2001 | Yamasaki et al. |
| 6,212,755 B1 | 4/2001 | Shimada et al. |
| 6,219,913 B1 | 4/2001 | Uchiyama |
| 6,220,896 B1 | 4/2001 | Bertoncini et al. |
| 6,224,432 B1 | 5/2001 | Billman |
| 6,227,882 B1 | 5/2001 | Ortega et al. |
| 6,241,535 B1 | 6/2001 | Lemke et al. |
| 6,267,604 B1 | 7/2001 | Mickievicz et al. |
| 6,269,539 B1 | 8/2001 | Takahashi et al. |
| 6,273,759 B1 | 8/2001 | Perino et al. |
| 6,280,209 B1 | 8/2001 | Bassler et al. |
| 6,293,827 B1 | 9/2001 | Stokoe et al. |
| 6,299,483 B1 | 10/2001 | Cohen et al. |
| 6,299,484 B2 | 10/2001 | Van Woensel et al. |
| 6,302,711 B1 | 10/2001 | Ito |
| 6,319,075 B1 | 11/2001 | Clark et al. |
| 6,322,379 B1 | 11/2001 | Ortega et al. |
| 6,322,393 B1 | 11/2001 | Doutrich et al. |
| 6,328,602 B1 | 12/2001 | Yamasaki et al. |
| 6,338,635 B1 | 1/2002 | Lee |
| 6,343,955 B2 | 2/2002 | Billman et al. |
| 6,347,952 B1 | 2/2002 | Hasegawa et al. |
| 6,347,962 B1 | 2/2002 | Kline |
| 6,350,134 B1 | 2/2002 | Fogg et al. |
| 6,354,877 B1 | 3/2002 | Shuey et al. |
| 6,358,061 B1 | 3/2002 | Regnier |
| 6,361,366 B1 | 3/2002 | Shuey et al. |
| 6,363,607 B1 | 4/2002 | Chen et al. |
| 6,364,710 B1 | 4/2002 | Billman et al. |
| 6,371,773 B1 | 4/2002 | Crofoot et al. |
| 6,375,474 B1 | 4/2002 | Harper et al. |
| 6,375,478 B1 | 4/2002 | Kikuchi |
| 6,379,188 B1 | 4/2002 | Cohen et al. |
| 6,386,914 B1 | 5/2002 | Collins et al. |
| 6,386,924 B2 | 5/2002 | Long |
| 6,390,826 B1 | 5/2002 | Affolter et al. |
| 6,409,543 B1 | 6/2002 | Astbury, Jr. et al. |
| 6,414,248 B1 | 7/2002 | Sundstrom |
| 6,420,778 B1 | 7/2002 | Sinyansky |
| 6,431,914 B1 | 8/2002 | Billman |
| 6,435,914 B1 | 8/2002 | Billman |
| 6,457,983 B1 | 10/2002 | Bassler et al. |
| 6,461,202 B2 | 10/2002 | Kline |
| 6,464,529 B1 | 10/2002 | Jensen et al. |
| 6,471,548 B2 | 10/2002 | Bertoncini et al. |
| 6,482,038 B2 | 11/2002 | Olson |
| 6,485,330 B1 | 11/2002 | Doutrich |
| 6,494,734 B1 | 12/2002 | Shuey |
| 6,503,103 B1 | 1/2003 | Cohen et al. |
| 6,506,076 B2 | 1/2003 | Cohen et al. |
| 6,506,081 B2 | 1/2003 | Blanchfield et al. |
| 6,520,803 B1 | 2/2003 | Dunn |
| 6,526,519 B1 | 2/2003 | Cuthbert |
| 6,527,587 B1 | 3/2003 | Ortega et al. |
| 6,528,737 B1 | 3/2003 | Kwong et al. |
| 6,530,134 B1 | 3/2003 | Laphan et al. |
| 6,537,086 B1 | 3/2003 | Mac Mullin |
| 6,537,087 B2 | 3/2003 | McNamara et al. |
| 6,537,111 B2 | 3/2003 | Brammer et al. |
| 6,540,522 B2 | 4/2003 | Sipe |
| 6,540,558 B1 | 4/2003 | Paagman |
| 6,540,559 B1 | 4/2003 | Kemmick et al. |
| 6,544,074 B2 | 4/2003 | Bricaud et al. |
| 6,547,066 B2 | 4/2003 | Koch |
| 6,551,140 B2 | 4/2003 | Billman et al. |
| 6,554,640 B1 | 4/2003 | Koike et al. |
| 6,554,647 B1 | 4/2003 | Cohen et al. |
| 6,561,849 B2 | 5/2003 | Naito et al. |
| 6,565,387 B2 | 5/2003 | Cohen |
| 6,565,388 B1 | 5/2003 | Van Woensel et al. |
| 6,572,409 B2 | 6/2003 | Nitta et al. |
| 6,572,410 B1 | 6/2003 | Volstorf et al. |
| 6,589,071 B1 | 7/2003 | Lias et al. |
| 6,592,381 B2 | 7/2003 | Cohen et al. |
| 6,602,095 B2 | 8/2003 | Astbury, Jr. et al. |
| 6,607,402 B2 | 8/2003 | Cohen et al. |
| 6,609,933 B2 | 8/2003 | Yamasaki |
| 6,633,490 B2 | 10/2003 | Centola et al. |
| 6,641,411 B1 | 11/2003 | Stoddard et al. |
| 6,641,825 B2 | 11/2003 | Scholz et al. |
| 6,648,657 B1 | 11/2003 | Korsunsky et al. |
| 6,652,318 B1 | 11/2003 | Winings et al. |
| 6,652,319 B1 | 11/2003 | Billman |
| 6,655,966 B2 | 12/2003 | Rothermel et al. |
| 6,659,808 B2 | 12/2003 | Billman et al. |
| 6,672,886 B2 | 1/2004 | Billman |
| 6,672,907 B2 | 1/2004 | Azuma |
| 6,692,272 B2 | 2/2004 | Lemke et al. |
| 6,695,627 B2 | 2/2004 | Ortega et al. |
| 6,712,646 B2 | 3/2004 | Shindo |
| 6,717,825 B2 | 4/2004 | Volstorf |
| 6,736,664 B2 | 5/2004 | Ueda et al. |
| 6,743,057 B2 | 6/2004 | Davis et al. |
| 6,746,278 B2 | 6/2004 | Nelson et al. |
| 6,749,439 B1 | 6/2004 | Potter et al. |
| 6,749,468 B2 | 6/2004 | Avery |
| 6,762,067 B1 | 7/2004 | Quinones et al. |
| 6,764,341 B2 | 7/2004 | Lappoehn |
| 6,776,649 B2 | 8/2004 | Pape et al. |
| 6,786,771 B2 | 9/2004 | Gailus |
| 6,797,215 B2 | 9/2004 | Bonk et al. |
| 6,799,215 B1 | 9/2004 | Giroir et al. |
| 6,805,278 B1 | 10/2004 | Olson et al. |
| 6,808,399 B2 | 10/2004 | Rothermel et al. |
| 6,808,420 B2 | 10/2004 | Whiteman, Jr. et al. |
| 6,824,391 B2 | 11/2004 | Mickievicz et al. |
| 6,835,072 B2 | 12/2004 | Simons et al. |
| 6,843,679 B2 | 1/2005 | Kuo et al. |
| 6,843,686 B2 | 1/2005 | Ohnishi et al. |
| 6,848,944 B2 | 2/2005 | Evans |
| 6,851,974 B2 | 2/2005 | Doutrich |
| 6,851,980 B2 | 2/2005 | Nelson et al. |
| 6,852,567 B1 | 2/2005 | Lee et al. |
| 6,863,543 B2 | 3/2005 | Lang et al. |
| 6,869,292 B2 | 3/2005 | Johnescu et al. |
| 6,872,085 B1 | 3/2005 | Cohen et al. |
| 6,884,117 B2 | 4/2005 | Korsunsky et al. |
| 6,890,214 B2 | 5/2005 | Brown et al. |
| 6,893,300 B2 | 5/2005 | Zhou et al. |
| 6,893,686 B2 | 5/2005 | Egan |
| 6,899,566 B2 | 5/2005 | Kline et al. |
| 6,902,411 B2 | 6/2005 | Kubo |
| 6,913,490 B2 | 7/2005 | Whiteman, Jr. et al. |
| 6,918,776 B2 | 7/2005 | Spink, Jr. |
| 6,918,789 B2 | 7/2005 | Lang et al. |
| 6,932,649 B1 | 8/2005 | Rothermel et al. |
| 6,939,173 B1 | 9/2005 | Elco et al. |
| 6,945,796 B2 | 9/2005 | Bassler et al. |
| 6,951,466 B2 | 10/2005 | Sandoval et al. |
| 6,953,351 B2 | 10/2005 | Fromm et al. |
| 6,960,103 B2 | 11/2005 | Tokunaga |

(56) References Cited

U.S. PATENT DOCUMENTS

| | | |
|---|---|---|
| 6,969,280 B2 | 11/2005 | Chien et al. |
| 6,976,886 B2 | 12/2005 | Winings et al. |
| 6,979,215 B2 | 12/2005 | Avery et al. |
| 6,981,883 B2 | 1/2006 | Raistrick et al. |
| 6,988,902 B2 | 1/2006 | Winings et al. |
| 6,994,569 B2 | 2/2006 | Minich et al. |
| 7,001,188 B2 | 2/2006 | Kobayashi |
| 7,021,975 B2 | 4/2006 | Lappohn |
| 7,040,901 B2 | 5/2006 | Benham et al. |
| 7,044,794 B2 * | 5/2006 | Consoli et al. ........... 439/607.07 |
| 7,048,589 B2 | 5/2006 | Bricaud et al. |
| 7,074,086 B2 | 7/2006 | Cohen et al. |
| 7,090,501 B1 | 8/2006 | Scherer et al. |
| 7,094,102 B2 | 8/2006 | Cohen et al. |
| 7,097,506 B2 | 8/2006 | Nakada |
| 7,101,191 B2 | 9/2006 | Benham |
| 7,108,556 B2 | 9/2006 | Cohen et al. |
| 7,112,082 B2 | 9/2006 | Tsai |
| 7,114,964 B2 | 10/2006 | Winings et al. |
| 7,118,391 B2 | 10/2006 | Minich et al. |
| 7,131,870 B2 | 11/2006 | Whiteman, Jr. et al. |
| 7,137,832 B2 | 11/2006 | Mongold et al. |
| 7,139,176 B2 | 11/2006 | Taniguchi et al. |
| 7,153,162 B2 | 12/2006 | Mizumura et al. |
| 7,160,117 B2 | 1/2007 | Ngo |
| 7,172,461 B2 | 2/2007 | Davis et al. |
| 7,175,446 B2 | 2/2007 | Bright et al. |
| 7,179,108 B2 | 2/2007 | Goodman et al. |
| 7,186,123 B2 | 3/2007 | Lemke et al. |
| 7,207,807 B2 | 4/2007 | Fogg |
| 7,207,836 B2 | 4/2007 | Tsai |
| 7,239,526 B1 | 7/2007 | Bibee |
| 7,241,168 B2 | 7/2007 | Sakurai et al. |
| 7,244,126 B2 | 7/2007 | Morana et al. |
| 7,247,050 B1 | 7/2007 | Minich |
| 7,270,574 B1 | 9/2007 | Ngo |
| 7,278,856 B2 | 10/2007 | Minich |
| 7,281,950 B2 | 10/2007 | Belopolsky |
| 7,285,018 B2 | 10/2007 | Kenny et al. |
| 7,286,372 B2 * | 10/2007 | Aronson ............. H05K 9/0058 174/260 |
| 7,292,055 B2 | 11/2007 | Egitto et al. |
| 7,310,875 B2 | 12/2007 | Evans |
| 7,322,855 B2 | 1/2008 | Mongold et al. |
| 7,331,802 B2 | 2/2008 | Rothermel et al. |
| 7,331,830 B2 | 2/2008 | Minich |
| 7,396,259 B2 | 7/2008 | Marshall |
| 7,407,387 B2 | 8/2008 | Johnescu et al. |
| 7,422,483 B2 | 9/2008 | Avery et al. |
| 7,429,176 B2 | 9/2008 | Johnescu et al. |
| 7,431,616 B2 | 10/2008 | Minich |
| 7,438,600 B1 | 10/2008 | Hung et al. |
| 7,462,924 B2 | 12/2008 | Shuey |
| 7,467,955 B2 | 12/2008 | Raistrick et al. |
| 7,494,379 B2 | 2/2009 | Do et al. |
| 7,494,381 B1 | 2/2009 | Wu et al. |
| 7,497,735 B2 | 3/2009 | Belopolsky |
| 7,497,736 B2 | 3/2009 | Minich et al. |
| 7,500,871 B2 | 3/2009 | Minich et al. |
| 7,503,804 B2 | 3/2009 | Minich |
| 7,524,209 B2 | 4/2009 | Hull et al. |
| 7,534,142 B2 | 5/2009 | Avery et al. |
| 7,553,182 B2 | 6/2009 | Buck et al. |
| 7,621,781 B2 | 11/2009 | Rothermel et al. |
| 7,651,337 B2 | 1/2010 | McNamara |
| 7,663,890 B2 * | 2/2010 | Nelson et al. ................. 361/760 |
| 7,670,185 B2 | 3/2010 | Zhang et al. |
| 7,762,843 B2 | 7/2010 | Minich et al. |
| 7,789,716 B2 | 9/2010 | Fedder et al. |
| 7,798,861 B2 | 9/2010 | Liu et al. |
| 7,811,100 B2 | 10/2010 | Stoner |
| 7,916,488 B2 | 3/2011 | Chang |
| 8,011,950 B2 * | 9/2011 | McGrath ............. H01R 12/594 439/497 |
| 8,062,046 B2 | 11/2011 | Daily et al. |
| 8,137,119 B2 | 3/2012 | Stoner |
| 8,361,896 B2 | 1/2013 | De Geest |
| 8,480,413 B2 | 7/2013 | Minich et al. |
| 8,616,919 B2 | 12/2013 | Stoner |
| 2001/0012729 A1 | 8/2001 | Van Woensel |
| 2001/0046810 A1 | 11/2001 | Cohen et al. |
| 2002/0017397 A1 * | 2/2002 | Ramey et al. ................. 174/255 |
| 2002/0039857 A1 | 4/2002 | Naito et al. |
| 2002/0084105 A1 | 7/2002 | Geng et al. |
| 2002/0098727 A1 | 7/2002 | McNamara et al. |
| 2002/0106930 A1 | 8/2002 | Pape et al. |
| 2002/0111068 A1 | 8/2002 | Cohen et al. |
| 2002/0115318 A1 | 8/2002 | Apicelli |
| 2002/0127903 A1 | 9/2002 | Billman et al. |
| 2003/0116857 A1 | 6/2003 | Taniguchi et al. |
| 2003/0123236 A1 | 7/2003 | McGrath et al. |
| 2003/0143894 A1 | 7/2003 | Kline et al. |
| 2003/0171010 A1 | 9/2003 | Winings et al. |
| 2003/0203665 A1 | 10/2003 | Ohnishi et al. |
| 2003/0220021 A1 | 11/2003 | Whiteman, Jr. et al. |
| 2004/0127098 A1 | 7/2004 | Kuo et al. |
| 2004/0157477 A1 | 8/2004 | Johnson et al. |
| 2004/0224559 A1 | 11/2004 | Nelson et al. |
| 2004/0235321 A1 | 11/2004 | Mizumura et al. |
| 2005/0009402 A1 | 1/2005 | Chien et al. |
| 2005/0032401 A1 | 2/2005 | Kobayashi |
| 2005/0048838 A1 | 3/2005 | Korsunsky et al. |
| 2005/0079763 A1 | 4/2005 | Lemke et al. |
| 2005/0101188 A1 | 5/2005 | Benham et al. |
| 2005/0118869 A1 | 6/2005 | Evans |
| 2005/0148239 A1 | 7/2005 | Hull et al. |
| 2005/0164555 A1 | 7/2005 | Winings et al. |
| 2005/0170700 A1 | 8/2005 | Shuey et al. |
| 2005/0196987 A1 | 9/2005 | Shuey et al. |
| 2005/0202722 A1 | 9/2005 | Regnier et al. |
| 2005/0215121 A1 | 9/2005 | Tokunaga |
| 2005/0227552 A1 | 10/2005 | Yamashita et al. |
| 2005/0277315 A1 | 12/2005 | Mongold et al. |
| 2005/0287869 A1 | 12/2005 | Kenny et al. |
| 2006/0003628 A1 | 1/2006 | Long et al. |
| 2006/0014433 A1 | 1/2006 | Consoli et al. |
| 2006/0024983 A1 | 2/2006 | Cohen et al. |
| 2006/0024984 A1 | 2/2006 | Cohen et al. |
| 2006/0046526 A1 | 3/2006 | Minich |
| 2006/0051987 A1 | 3/2006 | Goodman et al. |
| 2006/0068610 A1 | 3/2006 | Belopolsky |
| 2006/0068641 A1 | 3/2006 | Hull et al. |
| 2006/0073709 A1 | 4/2006 | Reid |
| 2006/0116857 A1 | 6/2006 | Sevic et al. |
| 2006/0121749 A1 | 6/2006 | Fogg |
| 2006/0160425 A1 | 7/2006 | Fuerst |
| 2006/0192274 A1 | 8/2006 | Lee et al. |
| 2006/0216969 A1 | 9/2006 | Bright et al. |
| 2006/0228912 A1 | 10/2006 | Morlion et al. |
| 2006/0232301 A1 | 10/2006 | Morlion et al. |
| 2007/0004287 A1 | 1/2007 | Marshall |
| 2007/0042639 A1 | 2/2007 | Manter et al. |
| 2007/0099455 A1 | 5/2007 | Rothermel et al. |
| 2007/0138617 A1 * | 6/2007 | Knighten et al. ............. 257/698 |
| 2007/0187141 A1 | 8/2007 | Bartholomew |
| 2007/0205774 A1 | 9/2007 | Minich |
| 2007/0207641 A1 | 9/2007 | Minich |
| 2008/0045079 A1 | 2/2008 | Minich et al. |
| 2008/0176453 A1 | 7/2008 | Minich et al. |
| 2008/0318450 A1 * | 12/2008 | Regnier et al. ................. 439/78 |
| 2008/0318478 A1 * | 12/2008 | Nelson ................... H05K 1/117 439/620.01 |
| 2009/0011641 A1 | 1/2009 | Cohen et al. |
| 2009/0017652 A1 | 1/2009 | Stoner |
| 2009/0017682 A1 | 1/2009 | Amleshi et al. |
| 2009/0149041 A1 | 6/2009 | Morlion et al. |
| 2009/0211088 A1 | 8/2009 | Bartholomew |
| 2009/0221165 A1 * | 9/2009 | Buck et al. ................. 439/108 |
| 2009/0267183 A1 * | 10/2009 | Temple et al. ................. 257/532 |
| 2009/0303689 A1 | 12/2009 | Chang |

(56) References Cited

U.S. PATENT DOCUMENTS

| | | | |
|---|---|---|---|
| 2011/0143596 | A1 | 6/2011 | Crighton |
| 2012/0190217 | A1 | 7/2012 | Tseng |

FOREIGN PATENT DOCUMENTS

| | | |
|---|---|---|
| EP | 0635910 | 1/1995 |
| EP | 0891016 | 1/1999 |
| EP | 0932226 | 7/1999 |
| EP | 1148587 | 10/2002 |
| EP | 1635429 | 3/2006 |
| EP | 1933422 | 6/2008 |
| JP | 2284372 | 11/1990 |
| JP | 3266383 | 11/1991 |
| JP | 6236788 | 8/1994 |
| JP | 7114958 | 5/1995 |
| JP | 07/320818 | 12/1995 |
| JP | 11/185886 | 7/1999 |
| JP | 2000/003743 | 1/2000 |
| JP | 2000/003744 | 1/2000 |
| JP | 2000/003745 | 1/2000 |
| JP | 2000/003746 | 1/2000 |
| JP | 2004/103527 | 4/2004 |
| JP | 2004/355820 | 12/2004 |
| JP | 2005/190820 | 7/2005 |
| TW | 201117685 | 5/2011 |
| TW | M408853 | 8/2011 |
| WO | WO 90/16093 | 12/1990 |
| WO | WO 01/29931 | 4/2001 |
| WO | WO 01/39332 | 5/2001 |
| WO | WO 02/101882 | 12/2002 |
| WO | WO 2006/031296 | 3/2006 |
| WO | WO 2006/105535 | 10/2006 |
| WO | WO 2008/082548 | 7/2008 |
| WO | WO 2010/068671 | 6/2010 |
| WO | WO 2012/047619 | 4/2012 |
| WO | WO 2012/080843 | 6/2012 |

OTHER PUBLICATIONS

"1.0 HDMI Right Angle Header Assembly (19 pin) Lead Free", Molex Incorporated, Jul. 20, 2004, 7 pages.
"1.90 by 1.35mm (.075 by.053) Pitch Impact, Backplane Connector System 3 and 4 Pair, Features and Specification", Molex, www.molex.com/link/Impact.html, 2008, 5 pages.
"4.0 UHD Connector: Differential Signal Crosstalk, Reflections", 1998, 8-9.
"AMP Z-Dok and Z-Dok and Connectors", Tyco Electronics/AMP, Application Specification #114-13068, Aug. 30, 2005, 17 pages.
"AMP Z-Pack 2mm HM Connector, 2mm Centerline, Eight-Row, Right-Angle Applications", Electrical Performance Report EPR 889065, Sep. 1998, 59 pages.
"AMP Z-Pack 2mm HM Interconnection System", 1992 and 1994, AMP Incorporated, 6 pages.
"AMP Z-Pack HM-Zd Performance at Gigabit Speeds", Tyco Electronics, Report#20GC014, May 4, 2001, 32 pages.
"B.? Bandwidth and Rise Budgets, Module 1-8, Fiber Optic Telecommunications (E-XVI- 2a)", http://cord.org/step_online/st1-8/st18exvi2a.htm, 2006, 1-3.
"Backplane Connectors", http://www.amphenol-tcs.com/products/connectors/backplane/index.html, Amphenol TCS (ATCS), Jun. 19, 2008, 1-3.
"Champ Z-Dok Connector System", Tyco Electronics, Jan. 2002, 3 pages.
"Cinch, QSFP+ High Speed Cables with Pair Shield™ Technology", Cinch QSFP + Training, Jan. 2010, 31 pages.
"Daughtercard Hole Pattern: Signal Modules (10 & 25 positions) Connector Assembly", Customer No. C-163-5101-500, Teradyne Connection Systems, Inc., 2001, 1 page.
"DesignCon 2009,Interconnect Design Optimization and Characterization for Advanced High Speed Backplane Channel Links", Molex, Inc., Jan. 2009, 38 pages.

"FCI's Airmax VS® High Speed Connector System", FCI Communications, Data, Consumer Division, www.fciconnect.com, 2004, 16 pages.
"FCI's Airmax VS Connector System Honored at DesignCon, 2005", Inc., http://www.heilind.com/products/fci/airmax-vs-design.asp, Heilind Electrnoics, 2005, 1 page.
"Framatome Connector Specification", May 10, 1999, 1 page.
Fusi et al., "Differential Signal Transmission through Backplanes and Connectors", Electronic Packaging and Production, Mar. 1996, 27-31.
"GbXI-Trac Backplane Connector System", www.molex.com/cgi-bin, Molex, 2007, 1-3.
"Gig-Array Connector System, Board to Board Connectors", 2005, 4 pages.
"Gig-Array High Speed Mezzanine Connectors 15-40 mm Board to Board", FCI Corporation, Jun. 5, 2006, 1 page.
Goel et al., "AMP Z-Pack Interconnect System", AMP Incorporated, 1990, 9 pages.
"HDM/HDM Plus, 2mm Backplane Interconnection System", Teradyne Connection Systems, 1993, 22 pages.
"HDM/HDM Plus Connectors", http://www.teradyne.com/prods/tcs/products/connectors/backplane/hdm/index.html, Amphenol TCS, 2006, 1 page.
"HDM Separable Interface Detail", Molex, Feb. 17, 1993, 3 pages.
"HDM Stacker Signal Integrity", http://www.teradyne.com/prods/tcs/products/connectors/mezzanine/hdm_stacker/signintegrity.html, Amphenol TCS (ATCS), Feb. 2, 2006, 1-3.
"High Definition Multimedia Interface (HDMI)", http://www.molex.com, Molex Incorporated, Jun. 19, 2008, 1-2.
"High Speed Backplane Connectors, Multigig RT Connector Products", Tyco Electronics, Apr. 2005, 21 pages.
"High Speed Backplane Interconnect Solutions", Tyco Electronics, 2007, 6 pages.
"High Speed Characterization Report, SEAM-30-02.0-S-10-2", www.samtec.com, SAMTEC, 2005, 55 pages.
"Honda High-Speed Backplane Connector NSP Series", Honda Connectors, Feb. 7, 2003, 25 pages.
Hult, "FCI's Problem Solving Approach Changes Market, The FCI Electronics AirMax VS", http://www.connectsupplier.com/tech_updates_FCI_Airmax_archive.htm, 2006, 1-4.
Hunsaker, "Ventura Application Design", TB-2127, Amphenol, Aug. 25, 2005, 13 pages.
"Impact 3 Pair 10 Column Signal Module", Tyco Electronics, Mar. 25, 2008, 1 page.
"Impact 3 Pair Header Unguided Open Assembly", Tyco Electronics, Apr. 11, 2008, 1 page.
"Impact Connector Offered by Tyco Electronics, High Speed Backplane Connector System", Tyco Electronics, Apr. 15, 2008, 12 pages.
International Patent Application No. PCT/US2008/002569: International Search Report and dated Sep. 26, 2008, 2 pages.
International Patent Application No. PCT/US2009/035388: International Search Report dated Oct. 12,2009, 11 pages.
International Patent Application No. PCT/US2010/059639: International Search Report dated Aug. 26, 2011, 3 pages.
International Patent Application No. PCT/US2012/058675: International Search Report dated Mar. 12, 2013, 8 pages.
"Lucent Technologies' Bell Labs and FCI Demonstrate 25gb/S Data Transmission over Electrical Backplane Connectors", http://www.lucent.com/press/0205/050201.bla.html, Lucent Tech Bell Labs, Feb. 1, 2005, 1-4.
"Metral 2mm High-Speed Connectors, 1000, 2000, 3000 Series, Electrical Performance Data for Differential Applications", FCI Framatome Group, 2000, 2 pages.
"Metral Speed & Density Extensions", FCI, Jun. 3, 1999, 25 pages.
"Mezzanine High-Speed High-Density Connectors Gig-Array and Meg-Array Electrical Performance Data", FCI Corporation, Jun. 5, 2008, 10 pages.
"MILLIPACS Connector, Type A Specification", Dec. 14, 2004,1 page.
Nadolny et al., "Optimizing Connector Selection for Gigabit Signal Speeds", http:--www.ecnmag.com-article-CA45245, ECN, Sep. 1, 2000, 6 pages.

(56) References Cited

OTHER PUBLICATIONS

"NSP Series, Backplane High-Speed Data Transmission Cable Connectors", http:--www.honda-connectors.co.jp, Honda Connectors, 2006, 6 pages, English Translation attached.
"Open Pin Field Array Seaf Series", www.samtec.com, SAMTEC, 2005, 1 page.
"Overview for High Density Backplane Connector (Z-Pack Tin-Man)", Tyco Electronics, 2008, 1 page.
"Overview for High Density Backplane Connectors, (Impact)", www.tycoelectronics.com/catalog, Tyco Electronics, 2007,1-2.
"Overview: Backplane Products", http:www.molex.com-cgi-bin-by-molex-super_family-super_family.jsp?BV_SessionID=@, Molex, 2008, 1-3.
"PCB-Mounted Receptacle Assemblies, 2.00 mm (0.079in) Centerlines, Right-Angle Solder-to-Board Signal Receptacle", Metral, Berg Electronics, 2001, 2 pages.
"Two-Piece, High-Speed Connectors", http://tycoelectronics.com/catalog, Tyco Electronics, 2007, 1-3.
"Tyco Unveils Z-Pack TinMan Orthogonal Connector System", http://www.epn-online.com/page/new59327/tyco-unveils-z-pack-tinman-orthogonal-conn, Oct. 13, 2009, 4 pages.
"Ventura High Performance, Highest Density Available", http://www.amphenol-tcs.com/products/connectors/backplane/ventura/index.html, Amphenol TCS (ATCS), Jun. 19, 2008, 2 pgs.
"VHDM Connector", http://www.teradyne.com/prods/tcs/products/connectors/backplane/vhdm/index/index.html, Amphenol TCS (ATCS), Jan. 31, 2006, 1-2.
"VHDM Daughterboard Connectors Feature Press-Fit Terminations and a Non-Stubbing Separable Interface", Teradyne Inc. Connections Sys Div, Oct. 8, 1997, 46 pages.
"VHDM High-Speed Differential (VHDM HSD)", http://www.teradyne.com/prods/bps/vhdm/hsd.html, Teradyne, Jan. 24, 2000, 6 pages.
"VHDM L-Series Connector", http://www.teradyne.com/prods/tcs/products/connectors/backplane/vhdm_l-series/index.html, Amphenol TCS(ATCS), 2006, 4 pages.
"XCede Connector", http://www.amphenol-tcs.com/products/connectors/backplane/xcede/index.html, 5 pages, Amphenol TCS (ATCS), Jun. 19, 2008, 1-5.
"Z-Dok and Connector", http://zdok.tycoecltronics.com, Tyco Electronics, May 23, 2003, 15 pages.
"Z-Pack Slim UHD", http://www.zpackuhd.com, Tyco Electronics, 2007, 8 pages.
"Z-Pack TinMan High Speed Orthogonal Connector Product Feature Selector", http://catalog.tycoelectronics.com/catalog/feat/en/s/24643?BML=10576.17560.17759, Tyco Electronics, 2009, 2 pages.
"Z-Pack TinMan Product Portofolio Expanded to Include 6-Pair Module", Tyco Electronics, Jun. 19, 2008, 1 page.

\* cited by examiner

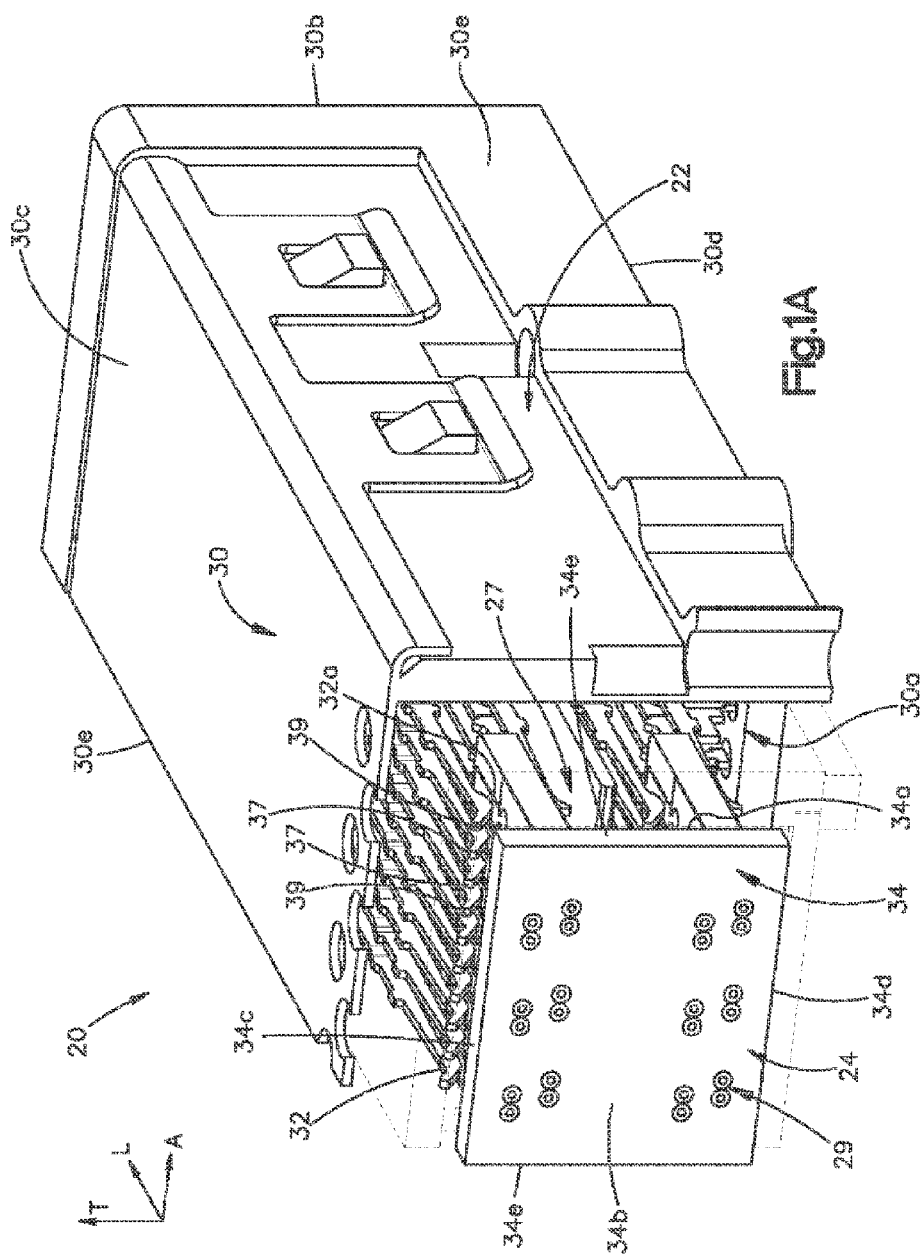

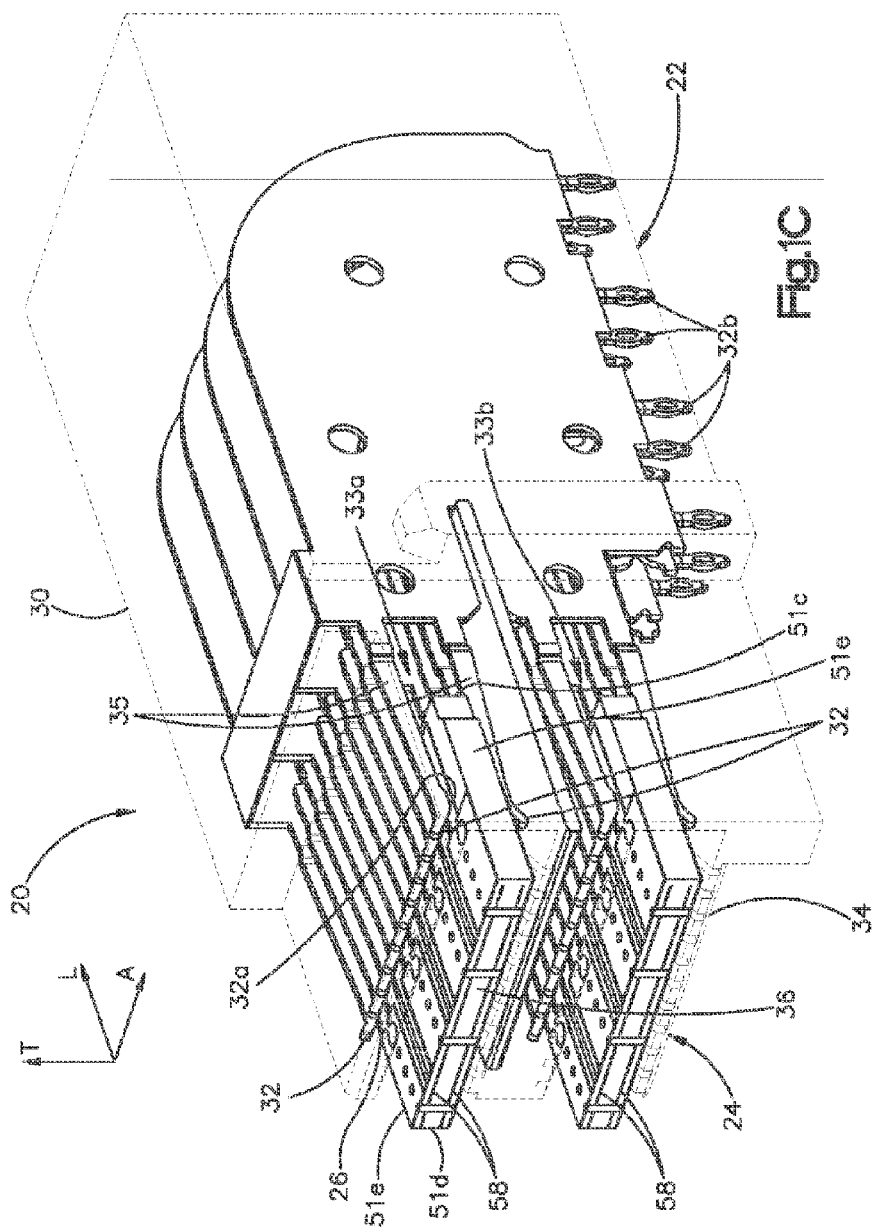

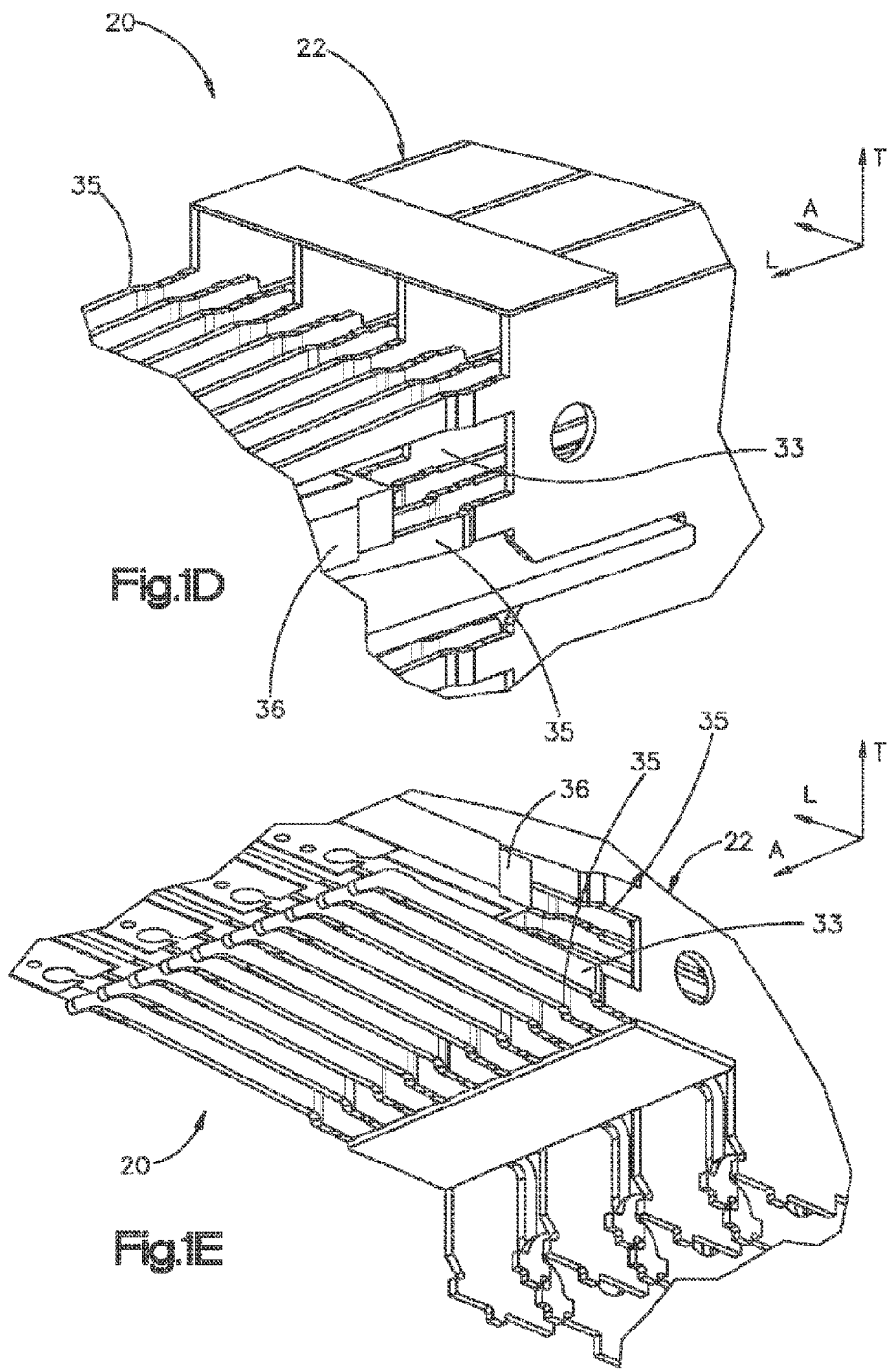

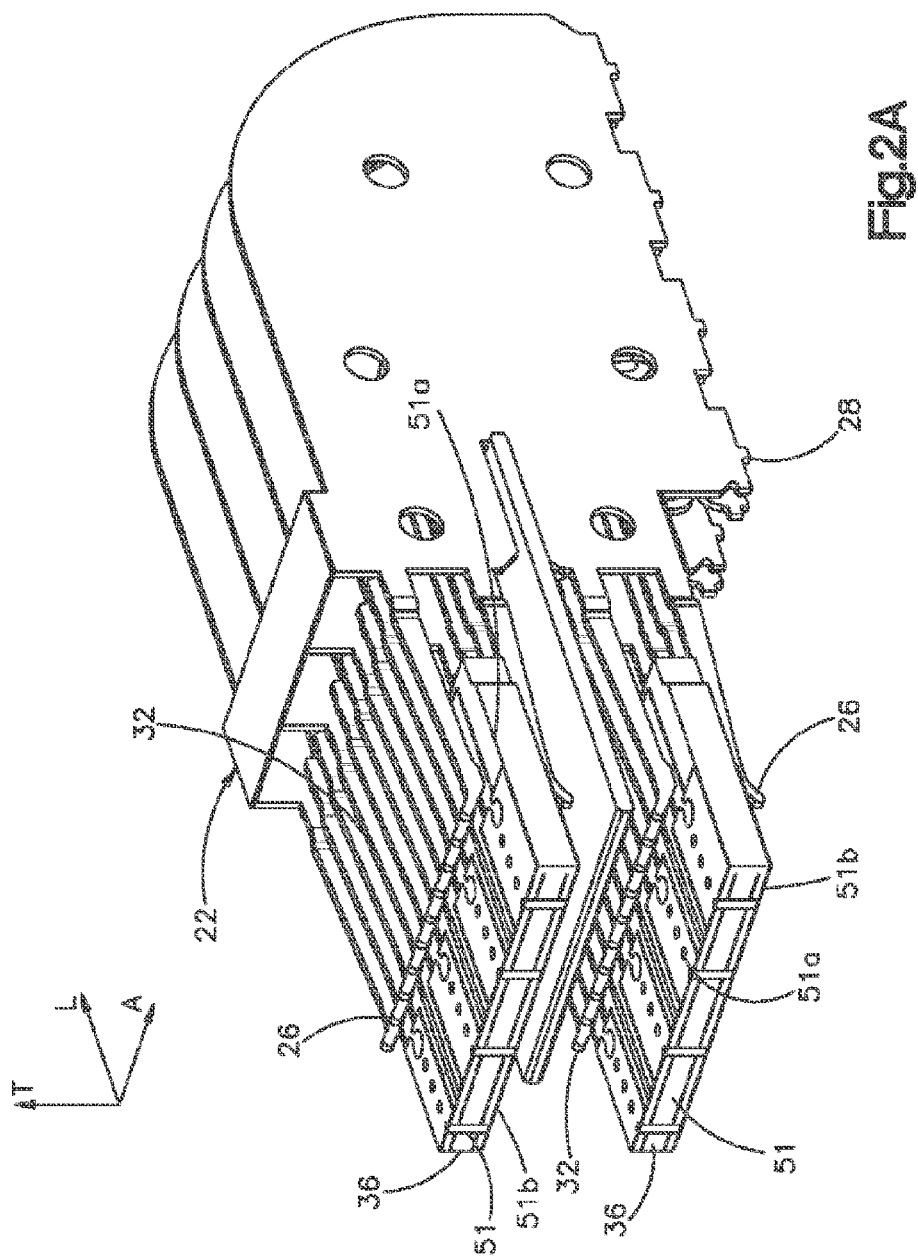

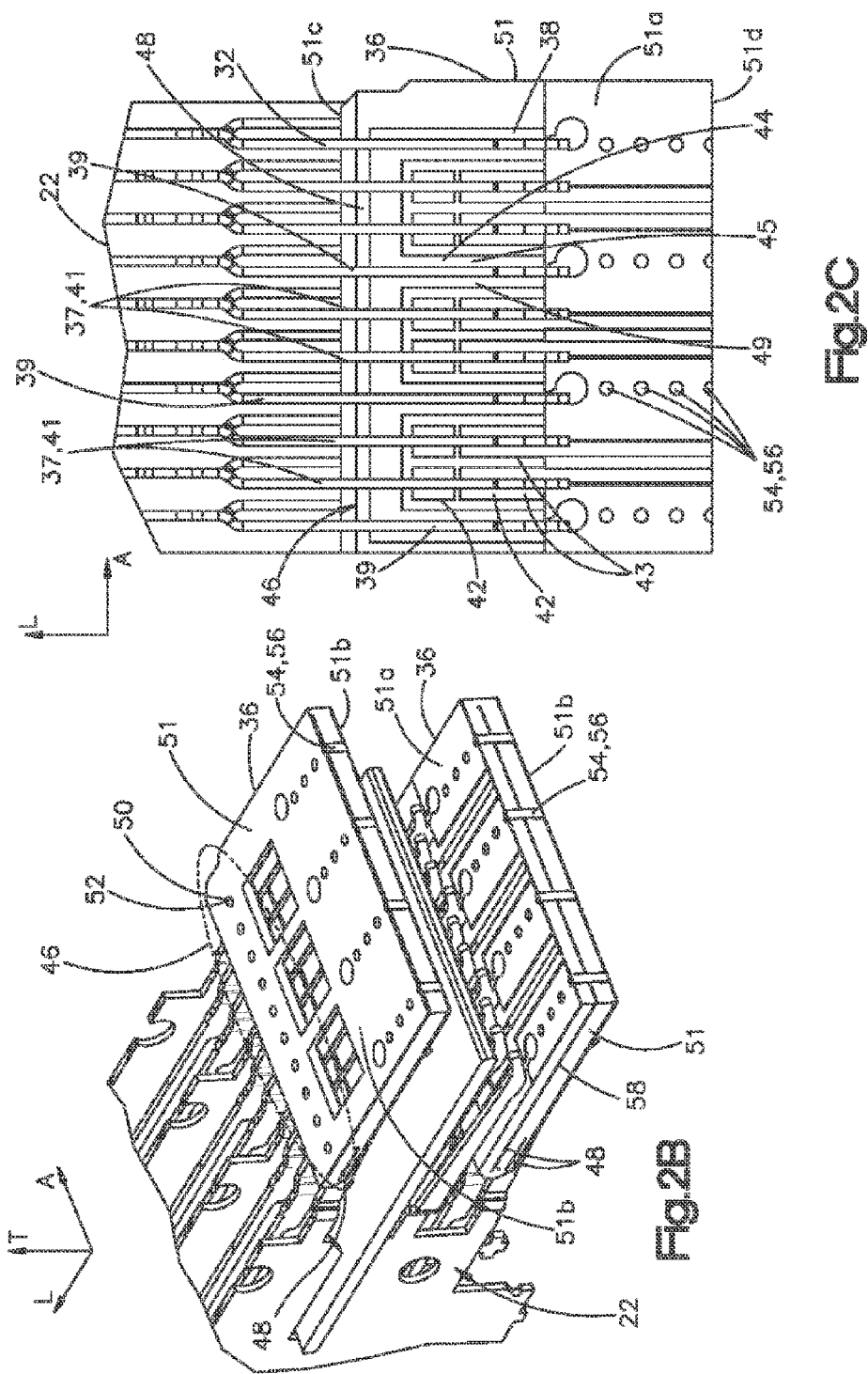

CROSS TALK REDUCTION FOR HIGH-SPEED ELECTRICAL CONNECTORS

CROSS REFERENCE TO RELATED APPLICATIONS

This application claims the benefit of U.S. Provisional Application No. 61/547,288 filed Oct. 14, 2011, the contents of which is hereby incorporated by reference herein in its entirety. This application is related by subject matter to U.S. Patent Application Ser. No. 12/393,794, filed on Feb. 26, 2009, and U.S. Patent Application Ser. No. 12/833,322, filed on Jul. 9, 2010 (now U.S. Pat. No. 8,137,119), the disclosure of each of which is hereby incorporated by reference as if set forth in its entirety herein.

BACKGROUND

Electrical connectors provide signal connections between electronic devices using signal contacts. Often, the signal contacts are so closely spaced that undesirable interference, or "cross talk," occurs between adjacent signal contacts. Cross talk occurs when a signal in one signal contact induces electrical interference in an adjacent signal contact due to interfering electrical fields, thereby compromising signal integrity. Cross talk may also occur between differential signal pairs. Cross talk generally increases as the distance between the interfering signal contacts is reduced.

With the continued miniaturization of electronic devices, and the ever-increasing desire for high-speed electronic communications, the reduction of cross talk is generally an important objective in electrical connector design.

SUMMARY

In one embodiment, a printed circuit board includes a printed circuit board body, a plurality of signal conductors, a plurality of ground conductors, and a ground coupling assembly that contacts and electrically connects at least a pair of the ground conductors.

BRIEF DESCRIPTION OF THE DRAWINGS

FIG. 1A is a perspective view of an electrical connector assembly constructed in accordance with one embodiment, including first and second electrical connectors;

FIGS. 1B through 1E depict additional perspective views of the electrical connector assembly illustrated in FIG. 1A;

FIG. 2A is a perspective view of a portion of the electrical connector assembly illustrated in FIG. 1A, including the first electrical connector and printed circuit boards of the second electrical connector;

FIG. 2B is a top perspective view of a portion of the electrical connector assembly illustrated in FIG. 2A with the upper surface the substrate body removed;

FIG. 2C is a top plan view the printed circuit boards of the electrical connector assembly illustrated in FIG. 2A;

FIG. 3A is a sectional side elevation view of the portion of the electrical connector assembly illustrated in FIG. 2A with.

DETAILED DESCRIPTION OF ILLUSTRATIVE EMBODIMENTS

Figure 1B:
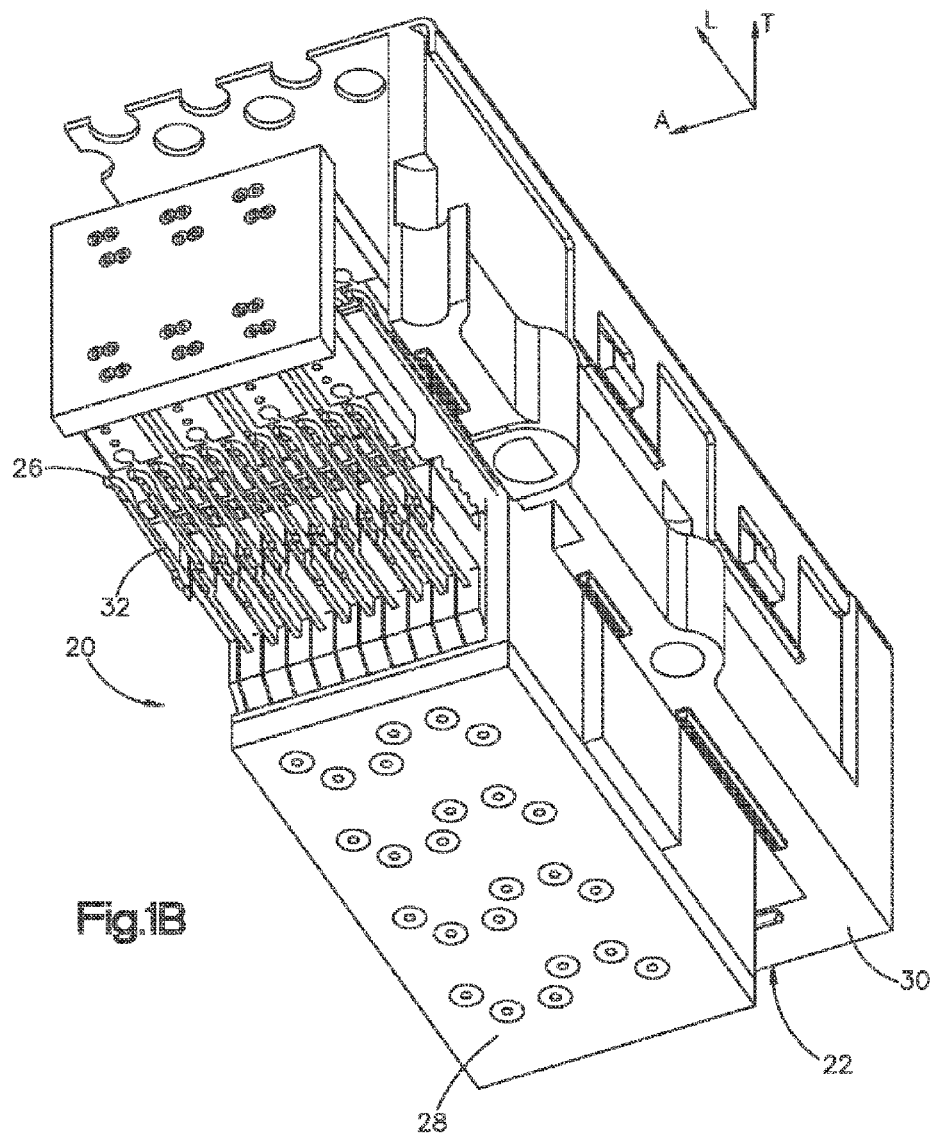
Figure 2D:
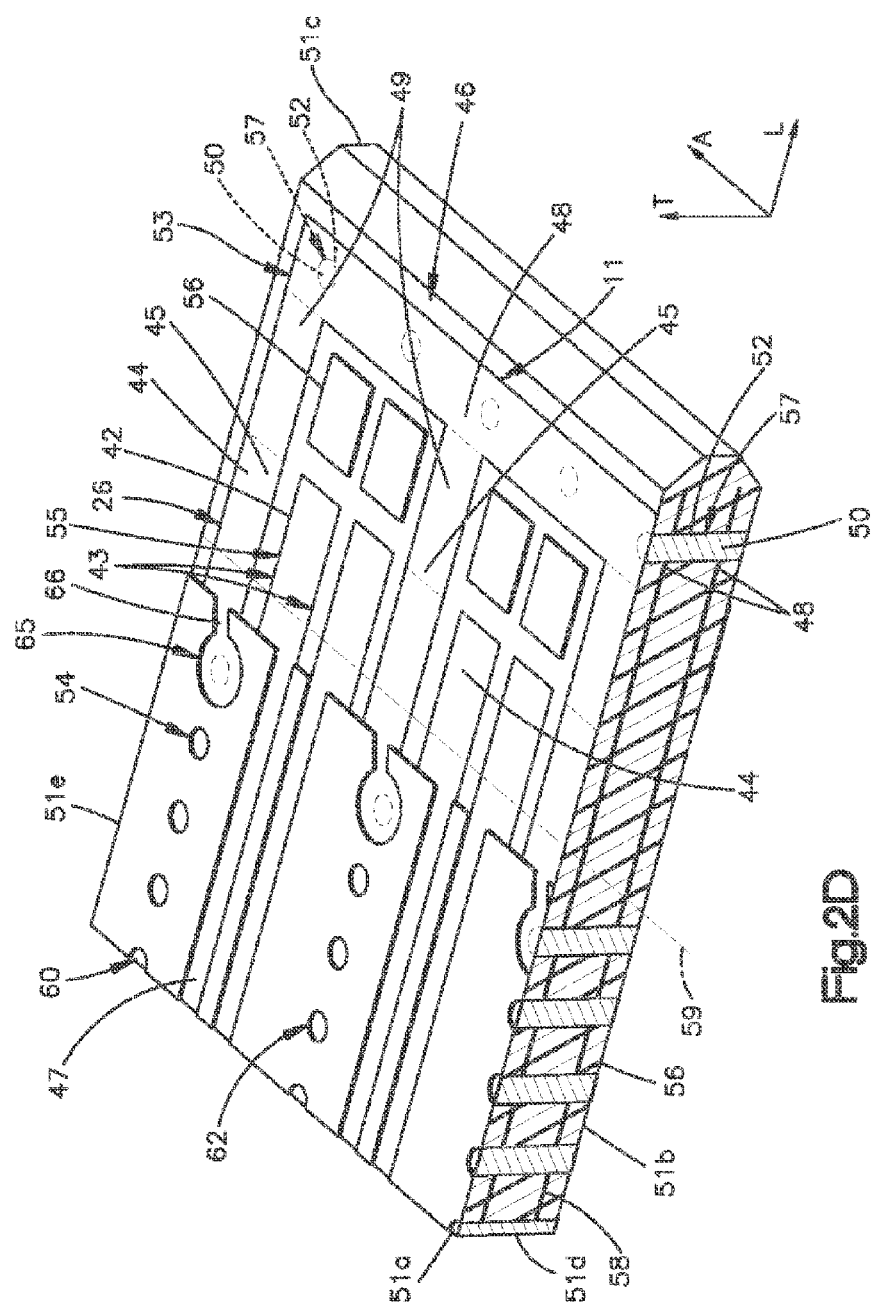
FIG. 2D is a top plan view of a portion of the electrical connector assembly illustrated in FIG. 2A.

Electrical performance of existing electrical connectors having differential signal pairs, such as serial advanced technology attachment (SATA), serial attached small computer system interface (SCSI or SAS), including mini-SAS HD connectors, CXP connectors, back panel, and mezzanine connectors can be improved by electrically connecting ground contacts within the connectors. Embodiments described herein allow for a simple retrofit of existing connectors designed to operate at slower data transmission rates, resulting in a drop-in compatible, higher data transmission speed connector this is also compliant with developing new standards such as SATA Revision 2.6, SAS-2 Revision 15, and IEEE 802.3ap, the disclosure of each of which is hereby incorporated by reference as if set forth in its entirety herein. More specifically, embodiments described herein can shift resonance frequencies of existing connectors to extend the existing operating frequency range without changing the mating or mounting interface dimensions of existing standardized or non-standardized connectors. Stated another way, the described embodiments can allow existing connectors to be modified and/or replaced to produce a modified connector within the confines of the existing connector housing dimensions so that the modified connector effectively operates at faster data transmission rates (within frequency domain and time domain crosstalk limits such as six percent or less at about 40 ps for time domain or about −24 dB or less (−26 dB) for frequency domain at about 40 ps set forth in the standards), yet still remain drop-in compatible with existing connectors that cannot operate with the parameters of the new developing standards. The embodiments described herein are simple to construct, yet provides a significant advantage to existing implementers of various standards and a significant cost savings to standard implementers and component suppliers.

Referring to FIGS. 1A-E, an electrical connector assembly 20 constructed in accordance with one embodiment includes a first electrical connector 22 and a complementary second electrical connector 24, such that the first and second electrical connectors 22 and 24 are configured to be mated with each other. As shown, the first electrical connector 22 may be a SAS connector, including a mini-SAS HD connector, a SATA connector, a CXP connector, or any suitable alternative electrical connector, including an optical connector, configured to facilitate electrical communications between a first electrical device and second electrical device. That is, the first electrical connector 22 may define a first or mating interface 26 configured to mate with the second electrical connector 24 so as to establish an electrical connection between the first and second electrical connectors 22 and 24, and a second or mounting interface 28 configured to be mounted onto a corresponding electrical component, such as a substrate which can be a printed circuit board, so as to establish an electrical connection between the first electrical connector 22 and the corresponding electrical component. Thus, when the first electrical connector 22 is fully mated with the second electrical connector 24 and the corresponding electrical component, the first electrical connector 22 places the substrate and the second electrical connector 24 in electrical communication with each other.

Referring also to FIGS. 2A-D, the first electrical connector 22 includes a dielectric or electrically insulative first connector housing 30 and a plurality of electrical contacts 32 that are supported by the first connector housing 30. The first connector housing 30 defines a front end 30a and an opposed rear end 30b that is spaced from the front end 30a along a longitudinal direction L, a top end 30c and an opposed bottom end 30d that is spaced from the top end 30c along a transverse direction T that is substantially perpendicular to the longitudinal direction L, and opposed sides 30e that are spaced from each other along a lateral direction A that is perpendicular to both the transverse direction T and the longitudinal direction L. Unless otherwise indicated herein, the terms "lateral," "longitudinal," and "transverse" are used to describe the orthogonal directional components of various components. The terms "inboard" and "inner," and "outboard" and "outer" and like terms when used with respect to a specified directional component are intended to refer to directions along the directional component toward and away from the center of the apparatus being described.

As will be appreciated from the description below, the front end 30a can define the mating interface 26 that is configured to be mated to the mating interface of the second electrical connector 24 along the longitudinal direction L, which can define a mating direction, and the bottom end 30d can define the mounting interface 28 that is configured to be mounted onto the corresponding electrical component along the transverse direction T, which can define a mounting direction. Because the mating interface 26 is oriented perpendicular with respect to the mounting interface 28, the electrical connector 22 can be referred to as a right-angle electrical connector. Alternatively, the electrical connector 22 can be configured as a vertical electrical connector, whereby the mating interface 26 is oriented parallel to the mounting interface 28.

It should be appreciated that while the longitudinal and lateral directions are illustrated as extending along a horizontal plane, and that the transverse direction is illustrated as extending along a vertical plane, the planes that encompass the various directions may differ during use, depending, for instance, on the orientation of the various components. Accordingly, the directional terms "vertical" and "horizontal" are used to describe the connector assembly 20 and its components as illustrated merely for the purposes of clarity and convenience, it being appreciated that these orientations may change during use.

Each of the electrical contacts 32 defines a mating end 32a that is disposed proximate to the mating interface 26 and configured to mate with a mating end of the complementary electrical contacts of the second electrical connector 24 when the first electrical connector 22 is mated to the second electrical connector 24. Each of the electrical contacts 32 further defines a mounting end 32b that is configured to be mounted to the corresponding electrical component. In accordance with the illustrated embodiment, the mating ends 32a are orientated along the longitudinal direction L, and the mounting ends 32b are orientated along the transverse direction T. Because the mating ends 32a are orientated perpendicular to the mounting end 32b, the electrical contacts 32 can be referred to as right-angle electrical contacts. Alternatively, the electrical contacts 32 can be configured as a vertical electrical contacts, whereby the mating ends 32a are oriented parallel to the mounting ends 32b.

The electrical contacts 32 can be arranged as desired. For instance, in accordance with the illustrated embodiment, the electrical contacts 32 define at least one row, such as a plurality of rows 35 of electrical contacts 32, the rows 35 spaced from each other along the transverse direction T at the mating interface 26. Thus, the electrical contacts 32 of each row 35 are spaced from each other along a row direction. The rows 35 can be spaced from each other along the longitudinal direction L at the mounting interface 28. The electrical contacts 32 of each of the rows 35 are spaced from each other along the lateral direction A. The electrical connector 22 can define at least one receptacle 33 at the mating interface 26 defined between adjacent rows 35 along the transverse direction T.

In accordance with the illustrated embodiment, the mating interface 26 defines two pairs of adjacent rows 35 of electrical contacts 32, such that each pair of adjacent rows 35 defines corresponding receptacles 33a and 33b that are spaced from each other along the transverse direction T and configured to receive a corresponding substrate or alternatively constructed mating end of the second electrical connector 24 so as to mate the first electrical connector 22 to the second electrical connector 24. Thus, the first electrical connector 22 can be referred to as a receptacle connector whose electrical contacts 32 are configured to receive the mating end of the second electrical connector 24. While the electrical connector 22 is illustrated as defining first and second receptacles 33a and 33b, it should be appreciated that the electrical connector 22 can define any number of receptacles 33, for instance at least one receptacle. Each receptacle 33 can be elongate along the lateral direction A and configured to receive the mating end of the second electrical connector 24 along the longitudinal mating direction. Each receptacle 33 is defined by a pair of electrical contacts 32 disposed on opposed transverse sides of the receptacle 33, such that the electrical contacts 32 are configured to establish an electrical connection with the substrate of the second electrical connector 24 that is inserted in the receptacle 33.

At least one up to all of the electrical contacts 32 can define signal contacts 37 and at least one such as a plurality of the electrical contacts 32 can define ground contacts 39 that can be disposed between adjacent signal contacts 37. For instance, adjacent signal contacts 37 of each row 35 that are spaced along the lateral direction A can define differential signal pairs 41, and the ground contacts 39 can be disposed between adjacent differential signal pairs 41 along the row 35, or can be otherwise disposed as desired. Thus, the electrical contacts 32 can define a repeating S-S-G pattern, G-S-S pattern, S-G-S pattern along the lateral direction A in the respective row 35, or can define any other pattern as desired, wherein "S" identifies a signal contact 37 and "G" identifies a ground contact 39.

With continuing reference to FIGS. 1A-1E, the second electrical connector 24 can include a dielectric or electrically insulative second connector housing 34 and at least one substrate 36 that is carried by the second connector housing 34. The second connector housing 34 can define a front end 34a and a rear end 34b that is spaced from the front end 34a along the longitudinal direction L, a top end 34c and a bottom end 34d that is spaced from the top end 34c along the transverse direction T, and opposed sides 34e that are spaced from each other along the lateral direction A. Each of the front end rear ends 34a and 34b can define respective front and rear surfaces that are elongate in a plane that is defined by the lateral direction A and the transverse direction T. The second electrical connector 24 defines a first or mating interface 27 that can be defined by the front end 34a of the second connector housing 34 and is configured to mate with the mating interface 26 of the first electrical connector 22 when the first and second electrical connectors 22 and 24 are mated to each other. The second electrical connector further defines a second or mounting interface 29 that is configured to be mounted onto a corresponding electrical component so as to establish an electrical connection between the second electrical connector 24 and the corresponding electrical component, which can include a plurality of cables. Thus, the second electrical connector 24 and the cable can define a cable assembly that is configured to mate with the first electrical connector 22 so as to place the at least one cable in electrical communication with the first electrical connector 22, and thus to the electrical component to which the first electrical connector 22 is mounted when the first electrical connector 22 is mounted to the corresponding electrical component.

Referring also to FIGS. 2A-2D, the electrical connector 24 can include a pair of substrates 36 that are supported by the second connector housing 34 and spaced from each other along the transverse direction T. Each of the substrates 36 can, for instance, be disposed proximate to the mating interface 27, and are configured to be inserted into respective ones of the corresponding pair of receptacles 33 of the first electrical connector 22 when the first electrical connector 22 is mated to the second electrical connector 24, thereby establishing an electrical connection between the substrates 36 and ones of the electrical contacts 32 of the first electrical connector 22. Accordingly, the electrical connector 24 can be referred to as a plug connector having at least one substrate 36 that is received in a corresponding receptacle of the first electrical connector 22 so as to establish an electrical connection between ones of the electrical contacts 32 of the first electrical connector 22 and the at least one substrate 36.

At least one or both of the substrates 36 includes a respective dielectric or electrically nonconductive substrate body 51 and at least one signal conductor 43 such as a plurality of signal conductors 43 that are supported by the substrate body 51, and at least one ground conductor 45 such as a plurality of ground conductors 45 that are supported by the substrate body 51. The substrate body 51, which can define a printed circuit board body, can define a first or upper surface 51a and a second or lower surface 51b that is spaced from the upper surface 51a along the transverse direction T. The upper surface 51a and the lower surface 51b can extend along the lateral direction A and the longitudinal direction L.

Each of the substrate bodies 51 can also define a third or front surface 51c and a fourth or rear surface 51d that each extends between the upper surface 51a and the lower surface 51b along lateral direction A and transverse direction T. It should be appreciated that the front and rear surfaces 51c and 51d define respective front and rear ends of the substrate body 51, and reference to the front and rear surfaces 51c and 51d further includes reference to the front and rear ends. The front surface 51c is spaced from the rear surface 51d along the longitudinal direction L, and is defined by a leading end of the respective substrate 36 with respect to insertion into a corresponding receptacle 33 of the first electrical connector 22. Each of the substrate bodies 51 can further define a midline 59 spaced equidistantly between the front surface 51c and the rear surface 51d.

The front surface 51c can be configured to be inserted into a corresponding one of the receptacles 33 of first electrical connector 22 along a forward longitudinal direction, such that rear surface 51d is disposed rearward of the corresponding receptacle 33 along the longitudinal direction L. Rear surface 51d can be configured to be supported by to connector housing 34, such that the signal conductors 43 are routed through the connector housing 34 so as to define the mounting interface 29. As illustrated, longitudinal direction L is the direction substrate 36 is inserted in order to be mated. Longitudinal direction L can therefore be referred to as the mating direction, which can be an insertion direction in accordance with the illustrated embodiment. Thus, it is to be understood that printed circuit board body defines a front surface 51c that is configured to be inserted into a receptacle 33 of a complementary electrical connector 22 along a mating direction, the printed circuit board body further defining a rear surface 51d opposite the front surface 51d along the mating direction As described above, each substrate 36 can include a plurality of electrical signal conductors 43 that are supported by the substrate body 51. Each signal conductor 43 can include a signal contact pad 42 and at least one electrically conductive signal trace 47 that is in electrical communication with the signal contact pad 42 and the mounting interface 29. For instance, the signal trace 47 can be monolithic with the contact pad 42. Each signal conductor 43 can elongate along the corresponding substrate body 51 in the longitudinal direction L. For instance, at least a portion of each signal conductor 43 can extend along one of the upper and lower surfaces 51a and 51b, or can be embedded in the substrate body 51 between the upper and lower surfaces 51a and 51b. In accordance with the illustrated embodiment, the signal contact pads 42 are carried by the respective one of the upper and lower surfaces 51a and 51b, and the signal trace 47 can be likewise carried by the respective one of the upper and lower surfaces 51a and 51b, or embedded in the substrate body 51 between the upper and lower surfaces 51a and 51b. When the substrate 36 is inserted into the receptacle 33 of the first electrical connector, the signal contact pads 42 that are carried by the upper surface 51a are configured to contact the electrical signal contacts 37 of one of the rows 35, for instance an upper row, of the pair of rows that defines the receptacle 33. Similarly, when the substrate 36 is inserted into the receptacle 33 of the first electrical connector 22, the signal contact pads 42 that are carried by the lower surface 51a are configured to contact the electrical signal contacts 37 of the other row, for instance the lower one of the rows 35 that defines the receptacle 33. The substrate body 51 can also contain at least one wear reduction pad 56 such as a plurality of wear reduction pads 56 that can be aligned with respective ones of the signal contact pads 42 along the longitudinal direction L. The wear reduction pads 66 can be disposed between the respective signal contact pads 42 and the electrically conductive trace 48.

Further as described above, each substrate 36 can include a plurality of electrical ground conductors 45 that are supported by the substrate body 51. At least one or both of the substrates 36 further support a plurality of ground conductors 45 that can each include a ground contact pad 44 and an electrically conductive trace 48 that is in electrical communication with the contact pad 44. For instance the electrically conductive trace 48 can be monolithic with the ground conductors 45 and contact pad 44. Each ground conductor 45 can extend along the corresponding substrate body 51 in the longitudinal direction L. For instance, at least a portion of each ground conductor 45 can extend along one of the upper and lower surfaces 51a and 51b, or can be embedded in the substrate body 51 between the upper and lower surfaces 51a and 51b. In accordance with the illustrated embodiment, the ground contact pads 44 are carried by the respective one of the upper and lower surfaces 51a and 51b, and the electrically conductive trace 48 can be likewise carried by the respective one of the upper and lower surfaces 51a and 51b, or embedded in the substrate body 51 between the upper and lower surfaces 51a and 51b. When the substrate 36 is inserted into the receptacle 33 of the first electrical connector, the ground contact pads 44 that are carried by the upper surface 51a are configured to contact the electrical ground contacts 39 of one of the rows 35, for instance an upper row, of the pair of rows that defines the receptacle 33. Similarly, when the substrate 36 is inserted into the receptacle 33 of the first electrical connector 22, the ground contact pads 44 that are carried by the lower surface 51a are configured to contact the electrical ground contacts 39 of the other row, for instance the lower one of the rows 35 that defines the receptacle 33. Thus, it is to be understood that the ground conductor 45 and signal conductors 43 are configured to be mated with respective complementary electrical ground contacts and electrical signal contacts of the complementary first electrical connector 22.

The ground conductor 45 can be located between adjacent signal conductors 43 and elongate along the corresponding substrate body 51 in the longitudinal direction L between the front surface 51*c* and the rear surface 51*d*. The signal conductors 43 and the ground conductors 45 may be spaced apart from one another and arranged along the lateral direction A, which can define a row direction. While the signal contact pads 42 and ground contact pads 44 may be aligned with one another along the row direction (as depicted in FIGS. 2A-2D), signal contact pads 42 and ground contact pads 44 may also be offset from one another along longitudinal direction L (and thus not aligned along the lateral direction A). Thus, it is to be understood that he printed circuit board body defines an upper surface 51*a* and a lower surface 51*b* that are spaced from each other along a direction perpendicular to the mating direction, each of the upper surface 51*a* and the lower surface 51*b* extending along the mating direction and a row direction, and the ground conductors 45 and signal conductors 43 being spaced from each other along the row direction. It is to be further understood that each of the front surface 51*c* and rear surface 51*d* extends along the row direction.

When the first and second electrical connectors 22 and 24 are fully mated to each other, each of the substrates 36 of the second electrical connector 24 are inserted into a respective one of the receptacles 33 of the first electrical connector 22 along the longitudinal direction L to a depth sufficient for the signal contact pads 42 to contact the mating ends 32*a* of the electrical signal contacts 37 of the first electrical connector 22 so as to mate with the complementary electrical signal contacts 37. Similarly, when the first and second electrical connectors 22 and 24 are fully mated to each other, each of the substrates 36 of the second electrical connector 24 are inserted into a respective one of the receptacles 33 of the first electrical connector 22 along the longitudinal direction L to a depth sufficient for the ground contact pads 44 to contact the mating ends 32*a* of the electrical ground contacts 39 of the first electrical connector 22 so as to mate with the complementary electrical signal contacts 39. Thus, adjacent signal conductors 43 along the lateral direction A can define differential signal pairs 55, and the ground conductors 45 can be disposed between adjacent a respective one of the differential signal pairs 55, for instance between adjacent differential signal pairs, or can otherwise disposed as desired. Thus, the signal conductors 43 and the ground conductors 45 can define a repeating S-S-G pattern, G-S-S pattern, S-G-S pattern, or any other pattern as desired along the lateral direction A, wherein "S" identifies a signal conductor 43 and "G" identifies a ground conductor 45.

With continuing reference to FIGS. 2A-2D, at least one up to all of the substrates 36 can include a ground coupling assembly 46 that is configured to electrically connect at least two ground conductors 45 while maintaining electrical isolation with respect to the signal conductors 43, such that a dielectric material, such as the substrate body 51 alone or in combination with air, separates all of the ground coupling assembly 46 from all of the signal conductors 43. In accordance with one embodiment, the ground coupling assembly 46 can be provided as one or more electrically conductive ground commoning members 53 that place at least two or more up to all of the ground contact pads 44 in electrical communication with each other. Example ground commoning members 53 include electrically conductive ground traces, some or all of which can be connected to each other or monolithic with each other so as to define an electrically common ground trace 61, and electrically conductive ground vias 57, which can each be defined by a ground via 52 and an electrically conductive ground mass 50 located inside the ground via 52 and extending along an entirety of the length of the ground via 52 along the transverse direction T, or along a direction that separates the upper and lower surfaces 51*a* and 51*b* from each other. For instance, the ground vias 52 can extend between the upper and lower surfaces 51*a* and 51*b*. For instance, at least one or up to all of the ground vias 52 can extend from the upper surface 51*a* to the lower surface 51*b*. Alternatively or additionally, at least one or up to all of the ground vias 52 can extend from the upper surface 51*a* toward the lower surface 51*b*, and terminate between the upper surface 51*a* and the lower surface 51*b*. Alternatively or additionally still, at least one or up to all of the ground vias 52 can extend from the lower surface 51*b* toward the upper surface 51*a*, and terminate between the upper surface 51*a* and the lower surface 51*b*. Alternatively or additionally, at least one or up to all of the ground vias 52 can extend from opposed terminal ends that are both disposed between the upper surface 51*a* and the lower surface 51*b*. Thus, it can be said that the ground vias 52 can extend at least partially through the substrate body 51, for instance partially or completely through the substrate body 51 or partially through the body 51.

At least one or more up to all of the ground coupling members 53 can be in electrical contact with at least two or more, up to all, of the ground conductors 45 that are spaced from each other along the row direction. For instance, the at least one or more up to all of the ground coupling members 53 can contact each of the at least two or more, up to all, of the ground conductors 45 at a location between the midline 59 and the front surface 51*c*. In accordance with the illustrated embodiment, the electrically conductive common ground trace 61 contacts the two or more, up to all, of the ground conductors 45 at a location between the midline 59 and the front surface 51*c*. Alternatively or additionally, one or more of the electrically conductive vias 57 can contact the two or more, up to all, of the ground conductors 45 at a location between the midline 59 and the front surface 51*c*.

As described above, the ground commoning members 53 can include electrically conductive ground traces, some or all of which can be connected to each other or monolithic with each other so as to define an electrically conductive common ground trace 61, and electrically conductive ground vias 57. For instance, the electrically conductive common ground trace 61 can include at least one electrically conductive trace 48 that extends along the lateral direction A between the opposed sides 51*e* of the substrate body 51, and a plurality of electrically conductive links 49 that extend between at least a select one of the electrically conductive traces 48 and individual ones of the ground conductors 45, for instance at the ground contact pads 44, thereby electrically connecting the individual ground contact pads 44, individual links 49, and the electrically conductive traces 48. For instance, a select electrically conductive trace 48 can be disposed along the upper surface 51*a* of the substrate body 51, and a select electrically conductive trace 48 can further be disposed along the lower surface 51*b* of the substrate body 51. Thus, the links 49 can contact the ground conductors 45, for instance at the ground contact pads 44, at a location between the midline 59 and the front surface 51*c* of the substrate body 51. It should be appreciated that the electrically conductive ground traces 61 can be constructed as desired, and can be devoid of the links 49, for instance when the select electrically conductive trace 48 contacts the ground conductors 45, for instance at a location between the midline 59 and the front surface 51*c* of the substrate body 51. In accordance with the illustrated embodiment, the links 49 space the electrically conductive trace 48 forward toward the front surface 51*c* of the substrate body 51 with respect to the ground contact pads 44. According to example embodiments, the conductive common ground trace 61 may be electrically connected to a pair of ground conductors 45 up to all of the ground conductors 45 carried by the substrate body 51. The ground conductors 45 and the conductive common ground trace 61 may also be integral and monolithic with each other.

In accordance with the embodiment illustrated in FIGS. 2A-2D, the electrically conductive traces 48, and thus the electrically conductive common ground trace 61, are connected between at least a pair up to all of the ground conductors 45. At least a portion up to all of the electrically conductive common ground trace 61 can extend along the upper surface 51a, can alternatively or additionally extend along the lower surface 51b, and can alternatively or additionally be embedded in the substrate body 51 at a location between the upper and lower surfaces 51a-b. The select electrically conductive trace 48, and up to all of the electrically conductive traces 48, can extend substantially across the substrate body 51 along the lateral direction A at a location spaced forward from the signal conductors 43, and thus between the signal conductors 43 and the front surface 51. Thus, the electrically conductive common ground trace 61 places the ground conductors 45 that are in electrical communication with the electrically conductive common ground trace 61 in electrical communication with each other. It is therefore to be understood that the ground coupling assembly 46 that is in electrical contact with at least two of the ground conductors at a location forward of the signal conductors 43 along a direction from the rear surface 51d toward the front surface 51c.

With continuing reference to FIGS. 2A-D, the ground coupling assembly 46 can include at least one electrically conductive ground mass such as a plurality of conductive ground masses 50 that extend along transverse direction T into or through the substrate body 51 at a location aligned with the electrically conductive traces 48. The electrically conductive common ground trace 61 and the conductive ground mass 50 can be constructed from any desirable electrically conductive material as desired. For instance, at least a portion of the electrically conductive ground common trace 61 can extend along a first surface of the substrate body 51, which can be the upper surface 51a in accordance with the illustrated embodiment, and the ground coupling assembly 46 can further include at least one such ground via 52 such as a plurality of ground vias 52 that extend toward a second surface that is spaced from the first surface along the transverse direction T. For instance, the electrically conductive common ground trace 61 can include a plurality of electrically conductive traces 48 that are carried by the substrate body 51. For instance, one of the electrically conductive traces 48 can extend along the upper surface 51a, the lower surface 51b, and/or between the upper and lower surfaces 51a and 51b. Thus, the second surface can be the lower surface 51b in accordance with the illustrated embodiment. It should thus further be appreciated that the first surface can be the lower surface 51b and the second surface can be the upper surface 51a. Thus, it is to be understood that the electrically conductive common ground trace 61 may contains a first electrically conductive trace 48 and a second electrically conductive trace 48 that is spaced from the first electrically conductive trace along a direction that is perpendicular to the mating direction, the second electrically conductive trace 48 being in electrical communication with the first electrically conductive trace 48 and elongate along a direction that is perpendicular to the mating direction. It is to be further understood that the first and second conductive traces 48 elongate along a third direction that is perpendicular to both the mating direction and the second direction, the second direction being perpendicular to the mating direction.

The ground masses 50 can be disposed in a corresponding one of the ground vias 52 to form electrically conductive ground vias 57, such that the ground masses 50 contact, and are in electrical communication with, two or more up to all of the electrically conductive traces 48. The ground masses 50 are thus in electrical communication with at least two up to all of the ground conductors 45. Further, the ground masses 50 and vias 52 can be aligned with the electrically conductive trace 48, and thus the electrically conductive common ground trace 61, such that the electrically conductive trace 48 or alternative portion of the electrically conductive common ground trace 61 (such as the links 49) overlays and contacts the ground mass 50 (see FIG. 2B). Alternatively, the ground masses and vias can extend through the electrically conductive trace 48, electrically conductive common ground trace 61, such that the conductive electrically conductive trace 48 or alternative location of the electrically conductive common ground trace 61 (such as the links 49) contacts the ground mass 50.

In accordance with the illustrated embodiment, the ground masses 50 can be spaced along a center-to-center distance along the lateral direction A that is substantially equal to a center-to-center distance between adjacent ones of the contact pads (including the signal contact pads 42 and the ground contact pads 44) in the lateral direction A. Thus, it is to be understood that the vias 57 are spaced a center-to-center distance along the row direction that is equal to that of the distance between adjacent signal conductors 43 and ground conductors 45 along the row direction.

As described above, the ground coupling assembly 46 can include at least one electrically conductive common ground trace 61 that extends along the upper surface 51a, and can further include electrically conductive traces 48 that extend along the upper surface 51a, between the upper and lower surfaces 51a-b, and along the lower surface 51b. Each of the electrically conductive traces 48 in the ground coupling assembly 46 may be spaced in a column along the transverse direction T between the upper and lower surfaces 51a and 51b of the substrate 36. Additionally, each of the electrically conductive traces 48 may be spaced between the upper and lower surfaces 51a and 51b of the substrate 36 in a direction that includes the transverse direction T in addition to one or both of longitudinal direction L and lateral direction A. The at least one ground mass 50 can extend between two or more of the electrically conductive traces 48 of the ground coupling assembly 46 so as to place each of the ground traces of at least a pair or more up to all of the ground conductors 45 in electrical communication with each other. Thus, it is to be understood that a via and an electrically conductive ground mass located inside the via extend between a first electrically conductive trace 48 and a second electrically conductive trace 48.

With continuing reference to FIGS. 2A-D, in addition to the electrically conductive ground vias 57, the substrate 36 can further include additional electrically conductive ground vias 54 and 65 that extend through substrate 36, and can be arranged in columns 60 oriented along the longitudinal direction L and rows 62 oriented along the lateral direction A. The conductive ground vias 54 and 65, as described above with respect to the electrically conductive ground vias 57, can each be defined by a ground via and an electrically conductive ground mass located inside the ground via. The conductive ground vias 65 are similar to conductive ground vias 54 and further include a large pad 65 electrically coupled to the ground contact pads 44 by trace 66. The columns 60 of the electrically conductive vias 54 and 65 can be aligned with respective one of the electrically conductive ground vias 57.

The columns 60 of the electrically conductive vias 54 and 65 may be located between adjacent signal traces 47, for instance between adjacent differential pairs 55. The additional electrically conductive vias 54 and 65 may be electrically connected together by, for example, at least one ground trace 58. Ground trace 58 may electrically connect at least a pair up to all of the electrically conductive vias 54 and 65 and extend along the longitudinal direction L and/or lateral direction A between surfaces 51a and 51b or on one or both of surface 51a or 51b. For example, one or more of the electrically conductive traces 58 can further be connected to one or more, up to all, of the conductive ground vias 54 and 65. For instance, one or more of the ground traces 58 can be connected to the conductive ground vias 54 and 65 of respective columns 60 alone or in combination with rows 62. Further, individual ground traces 58 may be attached to electrically conductive trace 48 at select regions along lateral direction A.

Figure 3A:
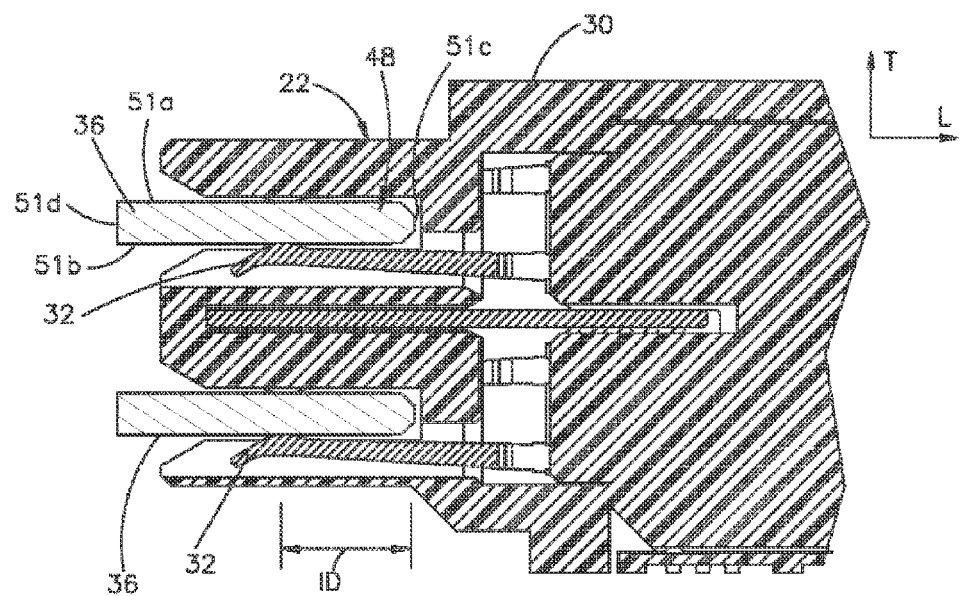
Figure 3B:
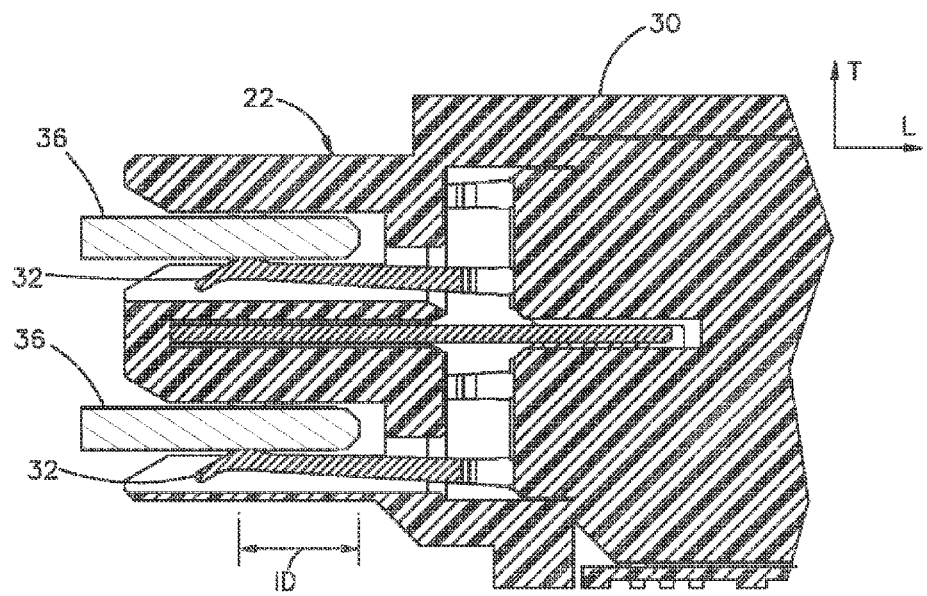
FIG. 3B is a sectional side elevation view of a portion of a conventional electrical connector assembly.

Referring now to FIGS. 3A-B, and as described above, when the first and second electrical connectors 22 and 24 are fully mated to each other, each of the substrates 36 is inserted into a respective one of the receptacles 33 of the first electrical connector 22 to an insertion depth sufficient for the signal contact pads 42 to mate with the electrical signal contacts 37 of the first electrical connector 22 and the ground contact pads 44 to mate with the electrical ground contacts 39 of the first electrical connector. For instance the signal contact pads 42 contact the mating ends 32a of complementary ones of the electrical signal contacts 37, and the ground contact pads 44 contact the mating ends 32a of complementary ones of the electrical ground contacts 39. As illustrated in FIG. 3A, when electrical connectors 22 and 24 are fully mated, the ground coupling assembly 46 of substrate 36 defines an insertion depth ID that is measured along the longitudinal direction L from a location of the contact pads 42 and 44 that contact the respective mating ends 32a of the electrical contacts 32 to the front surface 51c of the substrate body 51 along the longitudinal direction L. Thus, the insertion depth ID can also be defined by a distance along the longitudinal direction between the mating ends 32a and the front surface 51c of the substrate body 51 along the longitudinal direction L. The insertion depth ID can be greater than that of conventional substrates of the type illustrated in FIG. 3B that do not include the ground coupling assembly 46. In accordance with one embodiment, the insertion depth ID can be greater than that of the conventional substrate (for instance by 0.8 mm) in order to provide clearance for the ground masses 50 and the electrically conductive traces 48 that are disposed longitudinally forward with respect to the signal contact pads 42.

Furthermore, as illustrated, the first electrical connector 22 does not include any metallic shields, though it should be appreciated that, unless otherwise specified, the first electrical connector 22 can include one or more metallic shields that can be provided, for instance as metallic crosstalk plates that cover substantially the entire length of the signal contacts 37 if desired. Thus, unless otherwise indicated, the first electrical connector 22 can be a shieldless connector (that is, a connector that operates in the absence of metallic crosstalk plates).

Without being bound by theory, it is believed that shorting the ground contacts to each other at multiple locations makes the ground more robust and effectively shortens the electrical length of the ground, thereby shifting the electrical resonance of the ground contacts to higher frequencies. This improves both insertion loss and crosstalk. The ground coupling assembly 46 can thus achieve various performance advantages for the first electrical connector 22 and connector assembly 20, such as shifting the frequency at which resonance occurs, which can refer to a frequency at which significant unwanted signal degradation occurs as described in more detail below. Shifting significant unwanted insertion loss resonances to higher frequencies can allow for more usable bandwidth in the connector assembly 20. The data transfer rate can be increased until a resonance frequency is encountered. At the resonance frequency, the crosstalk becomes too high (i.e., above six percent for time domain or a comparable time domain measurement) or the insertion loss to crosstalk ratio becomes too low and the connector no longer functions acceptably (out of specification or loss of data). Furthermore, it is believed that shifting the above-described resonant frequencies can be achieved without substantially altering the impedance profile of the connector.

It should be noted that the illustrations and discussions of the embodiments shown in the figures are for exemplary purposes only, and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should be further appreciated that the various alternative embodiments described above with respect to one illustrated embodiment can apply to all embodiments as described herein, unless otherwise indicated.

What is claimed:

1. A printed circuit board comprising:
an electrically non-conductive substrate body defining a front end configured to be inserted into a receptacle of a complementary electrical connector along a mating direction, an upper surface and a lower surface spaced from the upper surface along a transverse direction, perpendicular to the mating direction;
a plurality of signal conductors supported by the substrate body and elongated along the mating direction;
a plurality of ground conductors elongated along the mating direction and supported by the substrate body, at least one of the plurality of ground conductors disposed at a location between adjacent ones of the signal conductors, each of the plurality of ground conductors and signal conductors supported at one of the upper surface and the lower surface and configured to mate with respective complementary electrical ground contacts and electrical signal contacts of the complementary electrical connector; and
an electrically conductive trace that is supported at the front end at the one of the upper surface and the lower surface of the substrate body, is elongate along a direction angled with respect to the mating direction and the transverse direction, and is in contact with at least two of the ground conductors at the one of the upper surface and the lower surface so as to electrically connect at least two of the ground conductors to each other; and
a second electrically conductive trace that is spaced from the first electrically conductive trace along the transverse direction, that is supported at the front end at the other of the upper surface and the lower surface, and that is in electrical communication with the first electrically conductive trace,
wherein the printed circuit board is a substrate that includes the electrically non-conductive substrate body, the plurality of signal conductors, the plurality of ground conductors, and the electrically conductive trace.

2. The printed circuit board of claim 1, wherein the printed circuit board defines a front surface and a rear surface spaced from the front surface in a direction opposite the mating direction, the printed circuit board further defines a midline that is equidistant between the front surface and the rear surface, and the electrically conductive trace and the second electrically conductive trace are supported at a location between the midline and the front surface.

3. The printed circuit board of claim 2, wherein the electrically conductive trace is elongate along a third direction that is perpendicular to both the mating direction and the transverse direction.

4. The printed circuit board of claim 2, further comprising a via and an electrically conductive ground mass located inside the via, the via and conductive ground mass extending between the first electrically conductive trace and the second electrically conductive trace.

5. The printed circuit board of claim 4, wherein the vias are spaced a center-to-center distance along a row direction that is equal to that of the distance between adjacent signal conductors and ground conductors along the row direction.

6. The printed circuit board of claim 1, wherein the electrically conductive trace is elongate along a direction that is perpendicular to the mating direction.

7. The printed circuit board of claim 1, wherein each of the upper surface and the lower surface extends along the mating direction and a row direction perpendicular to the mating direction and the transverse direction, and the ground conductors and signal conductors are spaced from each other along the row direction.

8. The printed circuit board of claim 7, wherein the electrically conductive trace is supported at the upper surface.

9. The printed circuit board of claim 7, wherein the electrically conductive trace is supported at the lower surface.

10. The printed circuit board of claim 7, comprising a third electrically conductive trace that is embedded between the upper surface and the lower surface.

11. The printed circuit board of claim 1, wherein the electrically conductive trace is in electrical communication with all of the ground conductors.

12. The printed circuit board of claim 1, wherein the electrically conductive trace and the ground conductors are integral and monolithic with each other.

13. The printed circuit board of claim 1, wherein adjacent signal conductors define differential signal pairs, and the least two of the ground conductors are each disposed between adjacent differential signal pairs.

14. The printed circuit board of claim 1, wherein the substrate terminates within a perimeter of the electrically non-conductive substrate body.

15. The printed circuit board of claim 1, further comprising:
   a second plurality of signal conductors elongated along the mating direction and supported by the other of the upper surface and the lower surface of the substrate body; and
   a second plurality of ground conductors elongated along the mating direction and supported by the other of the upper surface and the lower surface of the substrate body, at least one of the second plurality of ground conductors disposed at a location between adjacent ones of the signal conductors,
   wherein the second electrically conductive trace is in contact with at least two of the ground conductors of the second plurality of ground conductors at the other of the upper surface and the lower surface so as to electrically connect the at least two of the ground conductors of the second plurality of ground conductors to each other.

16. The printed circuit board of claim 15, further comprising a plurality of conductive vias extending between the upper and lower surfaces along the transverse direction, the plurality of conductive vias in contact with the electrically conductive trace and the second electrically conductive trace so as to electrically connect the electrically conductive trace to the second electrically conductive trace.

17. A printed circuit board comprising:
   an electrically non-conductive substrate body defining a front surface that is configured to be inserted into a receptacle of a complementary electrical connector along a mating direction, the substrate body further defining a rear surface opposite the front surface along the mating direction, and first and second surfaces that extend between the front and rear surfaces, the second surface spaced from the first surface along a transverse direction that is perpendicular to the mating direction;
   a plurality of signal conductors, each supported at one of the first and second surfaces of the substrate body;
   a plurality of ground conductors, each supported at one of the first and second surfaces of the substrate body, wherein at least one of the plurality of ground conductors is supported at the first surface at a location between adjacent ones of the signal conductors supported at the first surface, at least one of the plurality of ground conductors is supported at the second surface at a location between adjacent ones of the signal conductors supported at the second surface, and each of the plurality of ground conductors and signal conductors are configured to mate with respective complementary electrical ground contacts and electrical signal contacts of the complementary electrical connector; and
   a ground coupling assembly including first and second electrically conductive ground commoning members that are supported at the first and second surfaces of the substrate body, respectively, wherein each of the first and second electrically conductive ground commoning members is in contact with at least two of the ground conductors at a location that is 1) forward of the signal conductors along a direction from the rear surface toward the front surface, and 2) disposed between the front and rear surfaces of the substrate body,
   wherein the printed circuit board is a substrate that includes the electrically non-conductive substrate body, the plurality of signal conductors, the plurality of ground conductors, and the ground coupling assembly.

18. The printed circuit board of claim 17, wherein each of the first surface and the second surface extends along the mating direction and a row direction, the ground conductors and signal conductors are spaced from each other along the row direction, and each of the front and rear surfaces extends between the first and second surfaces.

19. The printed circuit board of claim 16, wherein each of the front and rear surfaces extends along the row direction.

20. The printed circuit board of claim 17, wherein the second electrically conductive ground commoning member is in electrical communication with the first electrically conductive ground commoning member.

21. The printed circuit board of claim 20, wherein the ground coupling assembly further comprises a via and a conductive ground mass located inside the via, the via and the conductive ground mass extending between the first electrically conductive ground coupling member and the second electrically conductive ground coupling member along the transverse direction.

22. The printed circuit board of claim 17, further comprising a via and a conductive ground mass located inside the via, the via and the conductive ground mass extending along a direction between the first and second surfaces, the via and the conductive ground mass being in electrical communication with the ground conductors.

23. The printed circuit board of claim 22, further comprising an electrically conductive trace that contacts both the electrically conductive ground mass and at least two ground conductors.

24. The printed circuit board of claim 17, wherein the substrate terminates within a perimeter of the electrically non-conductive substrate body.

25. A printed circuit board comprising:
an electrically non-conductive substrate body defining a front surface that is configured to be inserted into a receptacle of a complementary electrical connector along a mating direction, the substrate body further defining a rear surface opposite the front surface along the mating direction, first and second surfaces that extend between the front and rear surfaces, the second surface spaced from the first surface along a transverse direction that is perpendicular to the mating direction, and a midline disposed equidistantly between the rear surface and the front surface;
a plurality of signal conductors, each supported at one of the first and second surfaces the substrate body;
a plurality of ground conductors, each supported at one of the first and second surfaces of the substrate body at a location between adjacent ones of the signal conductors along a row direction, each of the plurality of ground conductors and signal conductors configured to mate with respective complementary electrical ground contacts and electrical signal contacts of the complementary electrical connector;
a ground coupling member that is supported at the first surface of the substrate body and is in electrical contact with at least two of the ground conductors that are spaced from each other along a row direction at the first surface, wherein the ground coupling member contacts each of the at least two ground conductors at the first surface at a location between the midline and the front surface; and
a second ground coupling member that is supported at the second surface of the substrate body and is in electrical contact with at least two of the ground conductors that are spaced from each other along a row direction at the second surface, wherein the ground coupling member contacts each of the at least two ground conductors at the second surface at a location between the midline and the front surface,
wherein the printed circuit board is a substrate that includes the electrically non- conductive substrate body, the plurality of signal conductors, the plurality of ground conductors, and the ground coupling member.

26. The printed circuit board of claim 25, wherein each of the first surface and the second surface extends along the mating direction and the row direction, and each of the front and rear surfaces extends between the first and second surfaces.

27. The printed circuit board of claim 26, wherein each of the front and rear surfaces extends along the row direction.

28. The printed circuit board of claim 25, wherein the substrate terminates within a perimeter of the electrically non-conductive substrate body.

29. An electrical connector comprising a printed circuit board configured to mate with an electrical receptacle connector, the printed circuit board comprising:
an electrically non-conductive substrate body defining a front surface configured to be inserted into the receptacle connector along a mating direction;
a plurality of signal conductors supported by the substrate body and elongated along the mating direction;
a plurality of ground conductors supported by the substrate body and elongated along the mating direction, at least one of the plurality of ground conductors disposed at a location between adjacent ones of the signal conductors, each of the plurality of ground conductors and signal conductors configured to mate with respective complementary electrical ground contacts and electrical signal contacts of the receptacle connector; and
a conductive ground commoning member that is supported by the substrate body and is in contact with at least two of the ground conductors, the conductive ground commoning member configured such that, when the electrical connector is mated with the electrical receptacle connector and the at least two ground conductors are in contact with respective ground contacts of the receptacle connector, the conductive ground commoning member electrically shorts the ground contacts of the receptacle connector to each other, thereby shifting electrical resonance of the receptacle connector and limiting time-domain crosstalk to six percent or less at about 40 ps.

* * * * *